(12) United States Patent
Yoshimizu

(10) Patent No.: US 12,029,034 B2
(45) Date of Patent: Jul. 2, 2024

(54) SEMICONDUCTOR STORAGE DEVICE AND MANUFACTURING METHOD THEREOF

(71) Applicant: KIOXIA CORPORATION, Tokyo (JP)

(72) Inventor: Yasuhito Yoshimizu, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 131 days.

(21) Appl. No.: 17/006,656

(22) Filed: Aug. 28, 2020

(65) Prior Publication Data
US 2021/0265386 A1    Aug. 26, 2021

(30) Foreign Application Priority Data

Feb. 25, 2020 (JP) ................... 2020-029627

(51) Int. Cl.
| | | |
|---|---|---|
| *H01L 27/11556* | (2017.01) | |
| *H01L 23/48* | (2006.01) | |
| *H01L 27/11524* | (2017.01) | |
| *H01L 27/1157* | (2017.01) | |
| *H01L 27/11582* | (2017.01) | |

(Continued)

(52) U.S. Cl.
CPC ............ *H10B 43/27* (2023.02); *H01L 23/481* (2013.01); *H10B 43/35* (2023.02)

(58) Field of Classification Search
CPC ........... H01L 23/5226; H01L 27/11582; H01L 27/11565; H01L 27/1157; H01L 21/764; H01L 27/11551; H01L 27/11575; H01L 27/11578; H01L 27/11556; H01L 27/11521; H01L 29/7926; H01L 21/28282; H10B 43/27; H10B 41/35; H10B 41/41;

(Continued)

(56) References Cited

U.S. PATENT DOCUMENTS

| | | | | |
|---|---|---|---|---|
| 8,237,211 B2* | 8/2012 | Fukuzumi | ............. | H10B 43/10 |
| | | | | 257/317 |
| 8,445,347 B2* | 5/2013 | Alsmeier | ............ | H01L 29/7889 |
| | | | | 257/E21.422 |

(Continued)

FOREIGN PATENT DOCUMENTS

| | | |
|---|---|---|
| JP | 2018152412 A | 9/2018 |
| JP | 2021027290 A | 2/2021 |

*Primary Examiner* — Mary A Wilczewski
*Assistant Examiner* — Tsz K Chiu
(74) *Attorney, Agent, or Firm* — Kim & Stewart LLP

(57) ABSTRACT

A semiconductor storage device includes a stacked body, a first columnar portion, a second columnar portion, and second insulating layers. The stacked body includes a plurality of conductive layers and a plurality of first insulating layers alternately stacked in a first direction. The first columnar portion being in a first region, and the second columnar portion being in a second region. The first columnar penetrates the stacked body in the first direction and includes a semiconductor layer. The second columnar portion penetrates the stacked body in the first direction and includes an insulating layer thereon. The second insulating layers are between the second columnar portion and either the conductive layers or the first insulating layers. The insulating layer on the second columnar portion. The second insulating layers are between the insulating layer on the second columnar portion and one of the conductive layers or the first insulating layers.

14 Claims, 21 Drawing Sheets

(51) Int. Cl.
  *H10B 43/27* (2023.01)
  *H10B 43/35* (2023.01)
(58) Field of Classification Search
  CPC ........ H10B 41/27; H10B 43/35; H10B 43/40; H10B 43/10; H10B 43/50
  See application file for complete search history.

(56) References Cited

U.S. PATENT DOCUMENTS

| | | | | |
|---|---|---|---|---|
| 8,476,713 B2* | 7/2013 | Lee | ..................... | H01L 29/7881 257/296 |
| 8,912,591 B2* | 12/2014 | Baek | ..................... | H10B 43/30 257/E27.103 |
| 9,634,024 B2* | 4/2017 | Kanamori | ........... | H01L 27/1157 |
| 10,490,667 B1* | 11/2019 | Zhou | ................... | H01L 21/8221 |
| 10,515,873 B2 | 12/2019 | Yoshimizu et al. | | |
| 10,622,368 B2* | 4/2020 | Kanakamedala | ...... | H10B 41/35 |
| 10,903,236 B2* | 1/2021 | Choi | ..................... | H10B 43/40 |
| 10,978,475 B2* | 4/2021 | Baek | ..................... | H01L 23/535 |
| 11,145,669 B2* | 10/2021 | Park | ..................... | H10B 43/50 |
| 11,233,004 B2* | 1/2022 | Lim | ..................... | H01L 27/11556 |
| 11,289,507 B2* | 3/2022 | Kanamori | .......... | H01L 21/31111 |
| 11,348,938 B2* | 5/2022 | Kim | ................... | H01L 21/31111 |
| 2004/0043550 A1 | 3/2004 | Chakihara | | |
| 2010/0163968 A1* | 7/2010 | Kim | ....................... | H10B 43/27 257/E21.423 |
| 2012/0012920 A1* | 1/2012 | Shin | ..................... | H01L 29/4234 257/E29.262 |
| 2013/0148398 A1* | 6/2013 | Baek | ................. | H01L 27/11568 257/E21.409 |
| 2013/0161726 A1* | 6/2013 | Kim | ................... | H01L 27/11582 257/E21.09 |
| 2014/0008714 A1* | 1/2014 | Makala | ............... | H01L 29/7889 257/E27.06 |
| 2014/0014889 A1* | 1/2014 | Shim | ................. | H01L 27/11556 257/774 |
| 2014/0273373 A1 | 9/2014 | Makala | | |
| 2015/0380431 A1 | 12/2015 | Kanamori | | |
| 2016/0126252 A1 | 5/2016 | Tsuda | | |
| 2017/0358590 A1* | 12/2017 | Kang | .................. | H01L 27/1157 |
| 2018/0026045 A1 | 1/2018 | Hu | | |
| 2018/0261529 A1 | 9/2018 | Yoshimizu et al. | | |
| 2019/0006383 A1 | 1/2019 | Matsuno | | |
| 2019/0287998 A1* | 9/2019 | Harada | ................. | H01L 27/249 |
| 2019/0296079 A1 | 9/2019 | Murakami et al. | | |
| 2021/0043640 A1 | 2/2021 | Kawaguchi et al. | | |

* cited by examiner

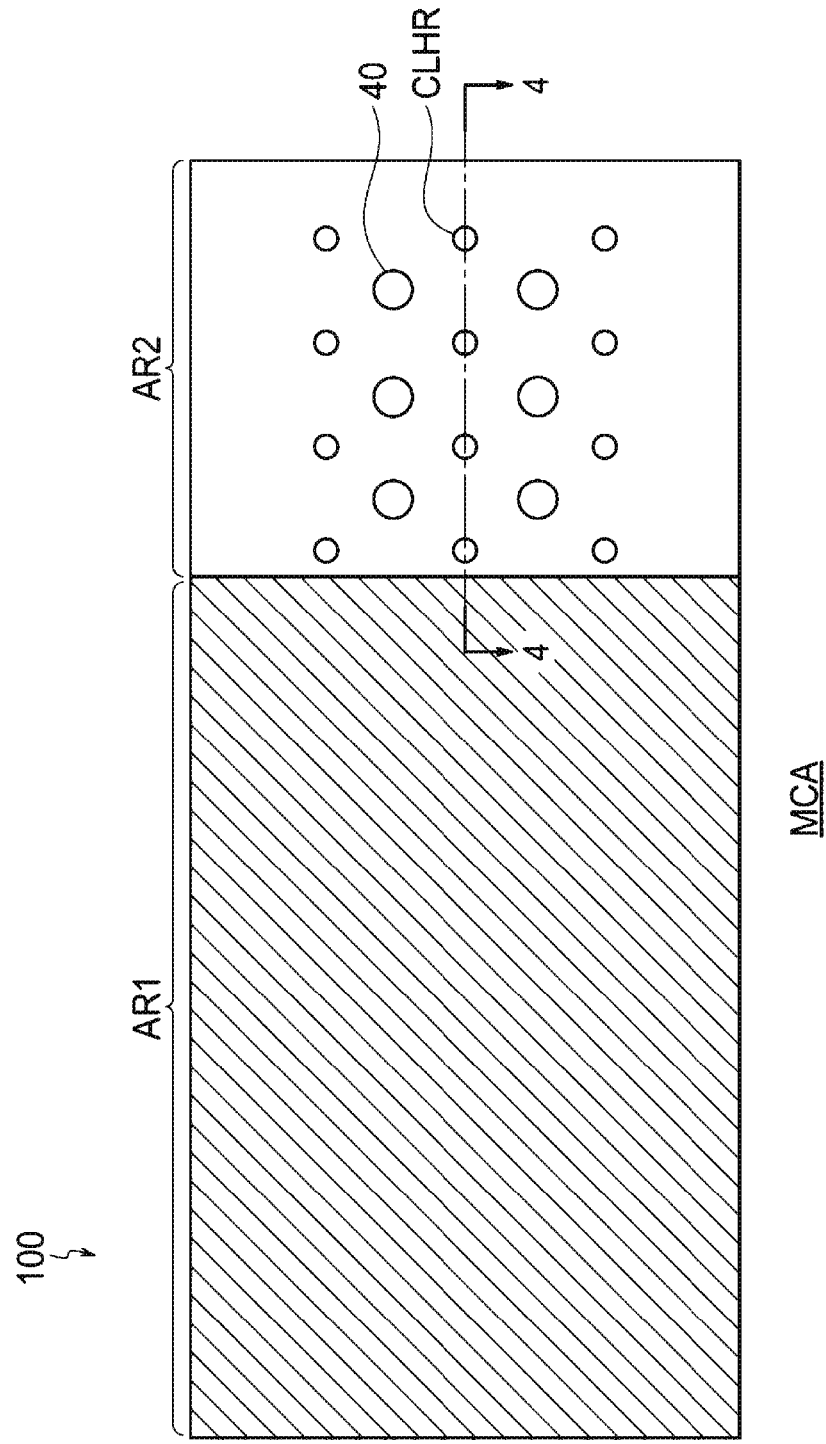

SEMICONDUCTOR STORAGE DEVICE AND MANUFACTURING METHOD THEREOF

CROSS-REFERENCE TO RELATED APPLICATION(S)

This application is based upon and claims the benefit of priority from Japanese Patent Application No. 2020-029627, filed Feb. 25, 2020, the entire contents of which are incorporated herein by reference.

FIELD

Embodiments described herein relate generally to a semiconductor storage device and a manufacturing method thereof.

BACKGROUND

A semiconductor storage device, such as a NAND-type electrically erasable programmable read-only memory (EEPROM), may include a memory cell array in which memory cells are three dimensionally arranged. Such a memory cell array includes a stacked body in which conductive layers, functioning as word lines, and insulating layers are alternately stacked. In order to form this stacked body, a method including selectively removing sacrificial layers from a stacked body initially formed with the sacrificial layers and the insulating layers, and then filling generated cavities with metal is known.

However, when the sacrificial layers are removed, the portions between the insulating layers become empty cavities, and thus the insulating layers may bend or deform because they are no longer supported by the sacrificial layer. Accordingly, it is more likely that the stacked structure will collapse or the like.

BRIEF DESCRIPTION OF THE DRAWINGS

FIG. 3 is a schematic plan view illustrating a memory cell array.

DETAILED DESCRIPTION

Figure 1:
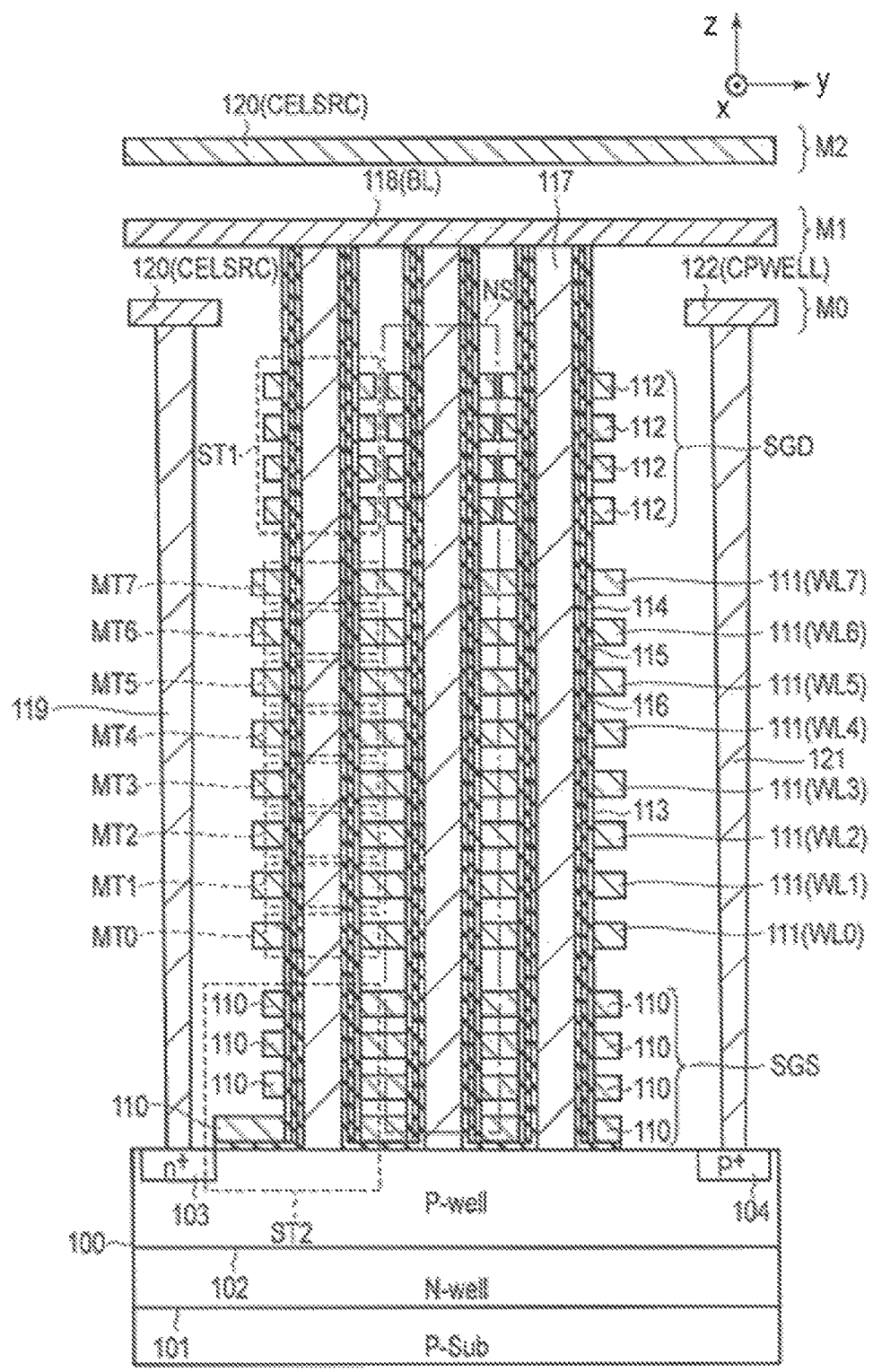
FIG. 1 is a diagram illustrating a memory cell array in a semiconductor storage device according to a first embodiment.

A semiconductor storage device and a manufacturing method of a semiconductor storage device for which deformation of the stacked structure in the semiconductor storage device can be prevented are described.

According to one or more embodiments, a semiconductor storage device includes a stacked body, a first columnar portion, a second columnar portion, and second insulating layers. The stacked body includes a plurality of conductive layers and a plurality of first insulating layers alternately stacked in a first direction. A first area and a second area adjacent to each other are in the stacked body. The first columnar portion is provided in the first area, penetrates the stacked body in the first direction and includes a semiconductor layer. The second columnar portion is provided in the second area and penetrates the stacked body in the first direction. The second insulating layers are provided between the second columnar portion and either the conductive layers or the first insulating layers, depending on embodiment. A third insulating layer is on the second columnar portion such that the second insulating layers are between the third insulating layer and the conductive layers or the first insulating layers, depending on the particular embodiment.

Hereinafter, example embodiments according to the present disclosure are described with reference to the drawings. The example embodiments do not limit the present disclosure. In the following embodiments, the vertical direction of a semiconductor substrate is a relative direction in which the surface on which the semiconductor element is provided is up and may be different from the vertical direction according to the gravitational acceleration. The drawings are schematic or conceptual, and the proportions of the respective parts are not necessarily the same as the actual ones. In the specification and the drawings, elements similar to those described in regard to the drawings already described are denoted by the same reference numerals, and detailed description thereof is appropriately omitted.

First Embodiment

FIG. 1 is a diagram illustrating an example of a configuration of a memory cell array in a semiconductor storage device according to a first embodiment. A memory cell array MCA (see FIG. 3) is, for example, a memory cell array in which memory cells are three dimensionally arranged (also referred to as a "3D memory cell array" or the like). In order to make the diagram easier to view, the insulating portions other than an insulating film formed in memory holes 113 are not illustrated in FIG. 1. In the following example embodiments, silicon is exemplified as a semiconductor material, but a semiconductor other than silicon may be used in other examples.

Herein, for convenience of description, an XYZ orthogonal coordinate system is introduced. In this coordinate system, two directions parallel to the main surface of a substrate 100 and orthogonal to each other are defined as an X direction and a Y direction, and a direction orthogonal to both the X direction and the Y direction is defined as a Z direction. A plurality of word lines (conductive layers) WL are stacked in the Z direction.

As illustrated in FIG. 1, an n type well region 101 is formed on the semiconductor substrate 100, and a p type well region 102 is formed on the n type well region 101. A plurality of NAND strings NS are formed on the p type well region 102. Specifically, a plurality of interconnection layers 110 functioning as select gate lines SGS, a plurality of interconnection layers 111 functioning as word lines WL, and a plurality of interconnection layers 112 functioning as select gate lines SGD are formed on the p type well region 102.

For example, four interconnection layers 110 are formed, electrically connected to the common select gate line SGS via the plurality of NAND strings NS, and function as gate electrodes of two select transistors ST2.

For example, eight interconnection layers 111 are formed, and each layer is electrically connected to the common word line WL.

For example, four interconnection layers 112 are formed, are electrically connected to the select gate line SGD corresponding to each of the NAND string NS, and each layer functions as a gate electrode of one select transistor ST1.

The memory hole 113 penetrates the interconnection layers 110, 111, and 112 and reaches the p type well region 102. A block insulating film 114, a charge storage layer 115 (insulating film), and a gate insulating film 116 are sequentially formed on the side surface of the memory hole 113. Conductive films 117 are embedded in the memory hole 113. The conductive films 117 function as current paths of the NAND strings NS. An interconnection layer 118 functioning as a bit line BL is formed on upper ends of the conductive films 117. Further details of the memory hole 113 are described below with reference to FIGS. 2A and 2B.

The select transistors ST2, a plurality of memory cell transistors MT, and the select transistor ST1 are sequentially stacked on the p type well region 102, and one memory hole 113 corresponds to one NAND string NS.

An n+ type impurity diffusion layer 103 and a p+ type impurity diffusion layer 104 are formed in the front surface of the p type well region 102.

A contact plug 119 is formed on the n+ type impurity diffusion layer 103, and an interconnection layer 120 functioning as a source line CELSRC is formed on the contact plug 119 on an M0 layer. The source line CELSRC is also formed on an M2 layer, and the source line CELSRC of the M2 layer is electrically connected to a voltage generation circuit.

A contact plug 121 is formed on the p+ type impurity diffusion layer 104, and an interconnection layer 122 functioning as a well wiring CPWELL is formed on the contact plug 121.

M0 layers in which the interconnection layers 120 and 122 are formed are formed over the interconnection layers 112 (the select gate lines SGD) and under an M1 layer on which the interconnection layer 118 is formed.

A plurality of the above configurations are arranged in a depth direction of FIG. 1 (that is, in the direction into the page of FIG. 1). One branch is configured with a set of the plurality of NAND strings NS arranged along a line in the depth direction.

The interconnection layers 110 function as the common select gate line SGS in the same block and are electrically connected to each other. The gate insulating film 116 at its lower end extends between the lowermost interconnection layer 110 and the upper surface of the p type well region 102. Both the lowermost interconnection layer 110, which is adjacent to the n+ type impurity diffusion layer 103, and the lower end portion of the gate insulating film 116, which extends underneath that lowermost interconnection layer 110, are formed further extending to the vicinity of the n+ type impurity diffusion layer 103.

Accordingly, when each of the select transistors ST2 is turned on, the thus-formed channel electrically connects the memory cell transistor MT0 and the n+ type impurity diffusion layer 103. The voltage generation circuit can give a potential to the conductive films 117 by applying a voltage to the well wiring CPWELL.

Figure 2A:
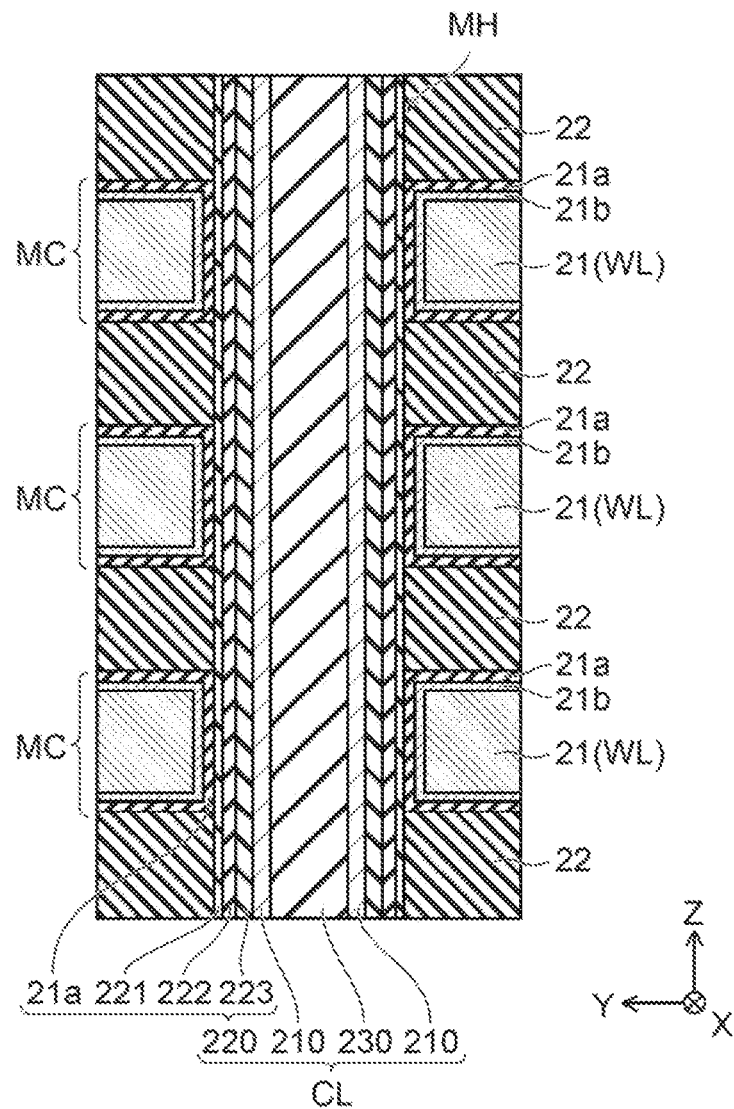
FIGS. 2A and 2B are schematic cross-sectional views illustrating a memory cell in a three-dimensional structure.
Figure 2B:
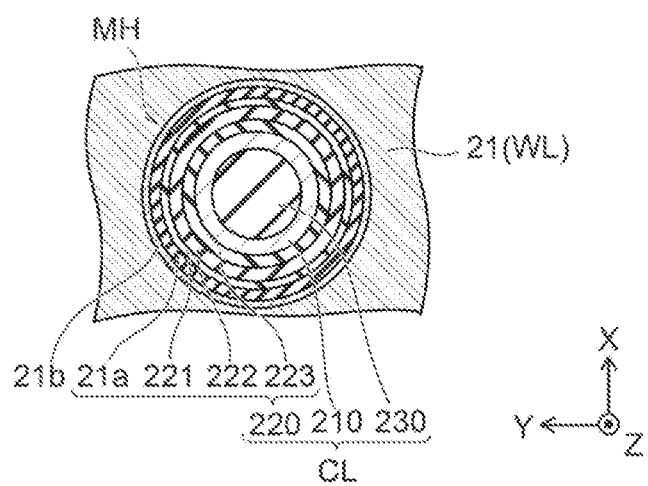

FIGS. 2A and 2B are schematic cross-sectional views illustrating a memory cell in a three-dimensional structure. A plurality of pillars CL are provided in the memory hole 113 (hereinafter, also referred to as a memory hole MH). Each of the plurality of pillars CL includes a semiconductor body 210, a memory film 220, and a core layer 230.

As illustrated in FIGS. 2A and 2B, the shape of the memory hole MH in the X-Y plane is a circle or an ellipse. Block insulating films 21a that constitute a portion of the memory film 220 may be provided between conductive layers 21 (which ultimately function as word lines WL in the present embodiment) and insulating layers 22. The block insulating film 21a is, for example, a silicon oxide film or a metal oxide film. One example of metal oxide is aluminum oxide. Barrier films 21b may be provided between the conductive layers 21 and the insulating layers 22 and between the conductive layers 21 and the memory film 220. In a case where each of the conductive layer 21 is, for example, tungsten, a stacked structure film of titanium nitride and titanium is selected as the barrier film 21b. The block insulating film 21a prevent back tunneling of charges from the conductive layer 21 to the memory film 220 side. The barrier film 21b improves adhesion between the conductive layer 21 and the block insulating film 21a.

The shape of the semiconductor body 210 has, for example, a cylindrical shape having a bottom. The semiconductor body 210 includes, for example, silicon. Silicon is, for example, polysilicon obtained by crystallizing amorphous silicon. The semiconductor body 210 is, for example, undoped silicon. The semiconductor body 210 may be p type silicon. The semiconductor body 210 becomes a channel of each of a drain-side select transistor, the memory cell MC, and a source-side select transistor.

The memory film 220 is provided between the inner surface of the memory hole MH and the semiconductor body 210. The shape of the memory film 220 is, for example, a cylindrical shape. Each of the memory cells MC has a storage region between the semiconductor body 210 and the conductive layer 21 to be the word line WL. These memory cells MC are stacked in the Z axis direction. The memory film 220 includes, for example, a cover insulating film 221, a charge trapping film 222, and a tunnel insulating film 223. Each of the semiconductor body 210, the charge trapping film 222, and the tunnel insulating film 223 extends in the Z axis direction.

The cover insulating film 221 is between the conductive layers 21 and the charge trapping film 222 and also between the insulating layers 22 and the charge trapping film 222. The cover insulating film 221 includes, for example, silicon oxide. The cover insulating film 221 protects the charge trapping film 222 so as not to be etched when a sacrificial film is replaced with the conductive layer 21 in a replacing step. In the replacing step, the cover insulating film 221 may be removed from a portion between the conductive layer 21 and the memory film 220. In this case, for example, the block insulating film 21a is provided between the conductive layer 21 and the charge trapping film 222. In a case where the replacing step is not used in the formation of the conductive layer 21, the cover insulating film 221 may not be used.

The charge trapping film 222 is provided between the cover insulating film 221 and the tunnel insulating film 223. The charge trapping film 222 includes, for example, silicon nitride and has a trap site for trapping charges in the film. In the charge trapping film 222, a portion interposed between the conductive layers 21 (which function as the word lines WL) and the semiconductor body 210 constitutes the storage region of the memory cell MC as a charge trapping portion. The threshold voltage of the memory cell MC changes depending on whether there is a charge in the charge trapping portion or the amount of the charges trapped in the charge trapping portion. Accordingly, the memory cell MC stores information.

The tunnel insulating film 223 is provided between the semiconductor body 210 and the charge trapping film 222. The tunnel insulating film 223 includes, for example, silicon oxide or silicon oxide and silicon nitride. The tunnel insulating film 223 is a potential barrier between the semiconductor body 210 and the charge trapping film 222. For example, when injecting electrons from the semiconductor body 210 to the charge trapping portion (write operation) or when injecting holes from the semiconductor body 210 to the charge trapping portion (erasing operation), the electrons and the holes each pass through (tunnel) the potential barrier of the tunnel insulating film 223.

The core layer 230 is embedded into the inside space of the cylindrical semiconductor body 210. The shape of the core layer 230 is, for example, a columnar shape. The core layer 230 includes, for example, silicon oxide and has insulating properties.

FIG. 3 is a schematic plan view illustrating an example of the configuration of the memory cell array MCA. As described with reference to FIGS. 1, 2A, and 2B, the memory cell array MCA has a stacked structure of the conductive layers 21 and the insulating layers 22 and has a plurality of memory cells arranged three dimensionally. Hereinafter, the conductive layer 21 is referred to as a conductive layer WL, and the insulating layer 22 is referred to as an insulating layer 25.

The memory cell array MCA has a rectangular shape in the present embodiment. The memory cell array MCA includes a cell area AR1 (may also be referred to as "a first area" herein) provided with a plurality of memory cells and a lead area AR2 (may also be referred to as "a second area" or "a lead out region" herein) on at least one side of an end portion of the memory cell array MCA. The lead area AR2 is a connection area for connecting contact plugs 40 to each conductive layer WL in the stacked structure.

Figure 4:
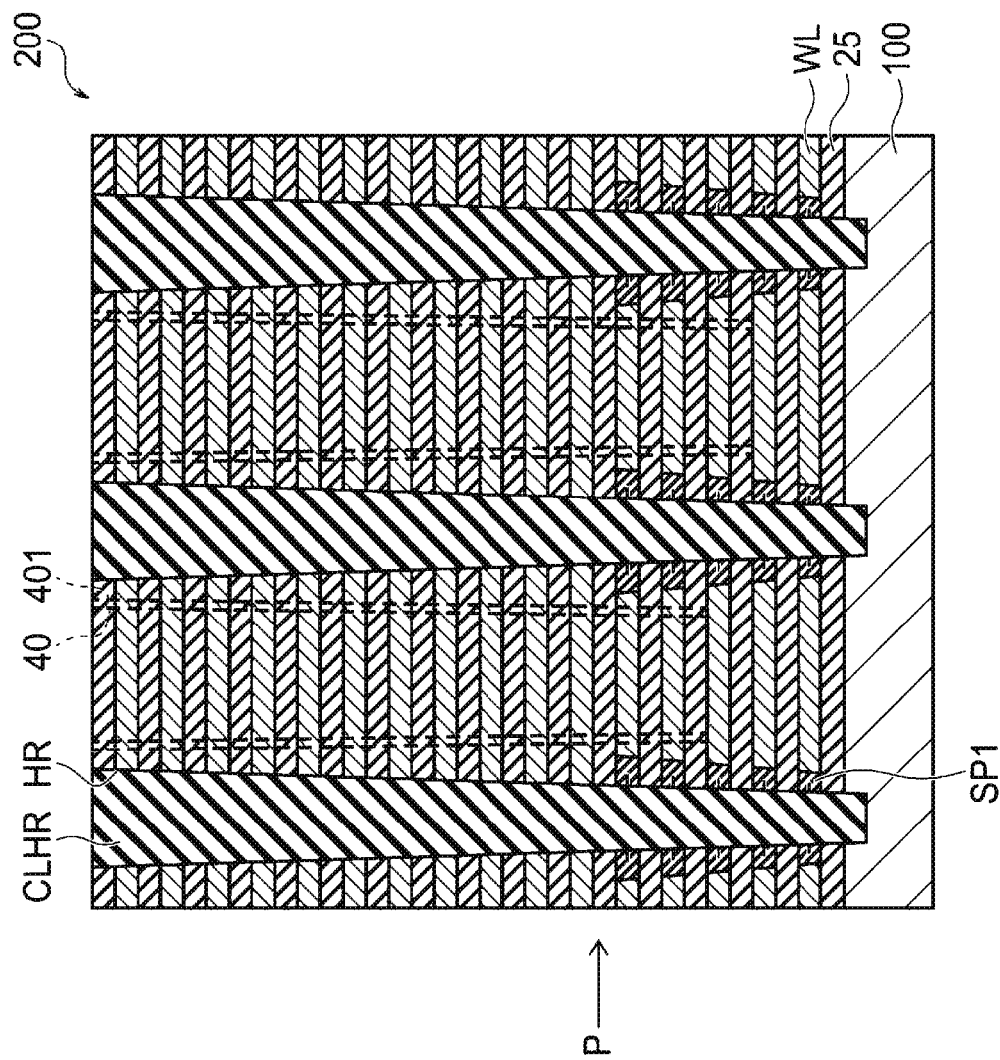
FIG. 4 is a cross-sectional view taken along a line 4-4 of FIG. 3.

FIG. 4 is a cross-sectional view taken along a line 4-4 of FIG. 3. FIG. 4 also illustrates the contact plugs 40 seen in the direction of the cross section with dotted lines.

The semiconductor storage device includes the semiconductor substrate 100, a stacked body 200, the pillars CL (may also be referred to as "first columnar portions" herein), the contact plugs 40, columnar portions CLHR (may also be referred to as "second columnar portions" herein), and insulating layers SP1 (may also be referred to as "second insulating layers" herein).

The stacked body 200 includes the plurality of conductive layers WL and the plurality of insulating layers 25 (may also be referred to as "first insulating layers" herein) which are alternately stacked in the stacking direction (may also be referred to as "first direction" herein). The cell area AR1 and the lead area AR2 seen in the stacking direction are defined in the stacked body 200. That is, the stacked body 200 includes the cell area AR1 and the lead area AR2. For example, a conductive material such as tungsten or doped silicon is used for the conductive layer WL. For example, an insulating material such as a silicon oxide film is used for the insulating layer 25.

As described with reference to FIGS. 1, 2A, and 2B, the plurality of pillars CL are provided in the cell area AR1 to penetrate the stacked body 200 in the stacking direction. Each pillar CL includes a semiconductor layer.

The plurality of contact plugs 40 are provided in the lead area AR2 such that each contact plug 40 penetrates the stacked body 200 in the stacking direction and that its end portion (that is a bottom surface in the present embodiment) is electrically connected to one of the plurality of conductive layers WL. In this case, for example, an insulating spacer 401 is provided on a side surface of each of the contact plugs 40. With the insulting spacer 401, each contact plug 40 is electrically insulated from the conductive layers WL other than the conductive layer WL to which the end portion of the contact plug 40 is connected. As illustrated in FIG. 4, the rest of the contact plugs 40 are connected to the different conductive layers WL. As the material of the contact plugs 40, for example, a conductive material such as tungsten is used.

The columnar portions CLHR are provided in the lead area AR2 to penetrate the stacked body 200 in the stacking direction. During a process of manufacturing the semiconductor storage device, sacrificial layers, that are sandwiched between the insulting layers 25 in the stacked body 200, will be removed to create gaps or cavities (hereinafter, collectively referred to as "gaps") where the conductive layers WL will subsequently be formed, and due to the gaps prior to the formation of the conductive layers WL, the insulating layers 25 may bend or deform. In the present embodiment, the columnar portions CLHR that penetrate the stacked body 200 in the lead area AR2 support the insulting layers 25 during the manufacturing process and can prevent such bending or deformation of the insulating layers 25, thereby ultimately preventing possible deformation or collapse of the stacked body 200. In the example illustrated in FIG. 4, the end portions of the respective columnar portions CLHR are in contact with the semiconductor substrate 100. In other instances, the end portions of the columnar portions CLHR may not be in contact with the semiconductor substrate 100.

In the present embodiment, the diameter of each of the columnar portions CLHR decreases downward in the stacking direction of the stacked body 200. For example, a plurality of holes HR may be formed in the stacked body 200 by the reactive ion etching (RIE) method, which makes the diameter of each of the hole HR gradually decrease in the thickness direction of the stacked body 200, and the columnar portion CLHR to be formed in each hole HR will have its diameter decrease in the same manner.

Each columnar portion CLHR includes one or more insulating layers (which may also be referred to as "third insulating layers" herein). The insulating layers prevent electrical conduction between the conductive layers WL via the columnar portion CLHR. Each columnar portion CLHR may be filled with, for example, an insulating material such as silicon oxide ($SiO_2$). The present embodiment is not limited to this, and other ways are available, taking into consideration the strength of the columnar portion CLHR. For example, as the columnar portion CLHR, silicon nitride (SiN) and the like may be used, or a structure in which an insulating spacer of silicon oxide or the like is provided around metal or silicon nitride may be used. In such case, the columnar portion CLHR is electrically insulated from the conductive layer WL by the insulating spacer. The insulating layer included in the columnar portion CLHR is provided at least on the side surface of the columnar portion CLHR. The insulating layers SP1 are between the insulating layer of the columnar portion CLHR and the conductive layers WL or the insulating layers 25.

In the example shown in FIG. 4, the insulating layers SP1 are provided between the conductive layers WL and the one or more insulating layers of the columnar portions CLHR. The insulating layers SP1 are provided on the outer periphery of each of the columnar portions CLHR in the plane parallel to the conductive layers WL. For example, the plurality of insulating layers SP1 extend annularly from the outer periphery of each columnar portion CLHR. This makes the diameter of each columnar portion CLHR in the plane parallel to the conductive layers WL, that is the total diameter of the columnar portion CLHR and insulating layer SP1 in the same plane, increase. On the other hand, as illustrated in FIG. 4, the region of each of the conductive layers WL decreases because of the insulating layer SP1 in the same plane. Accordingly, prior to or during the process of forming the conductive layers WL in the gaps created by the removal of the sacrificial layers between the stacked insulating layers 25, the insulating layers SP1 can support the insulating layers 25 together with the columnar portions CLHR and further narrow the regions of the gaps. Accordingly, possible deformation, such as bending, of the insulating layers 25 due to the gaps can be further effectively prevented. As a result, possible deformation of the stacked structure 200 due to such deformation of the insulating layers 25 is also effectively prevented, and the reliability of the semiconductor storage device comprising the stacked structure 200 can be improved or maintained at a desired level.

In the present embodiment, the insulating layers SP1 are provided below a predetermined position P as shown in FIG. 4. For example, the position P is determined as a position where the diameter of the columnar portion CLHR becomes small to a certain extent as it stretches downward in the stacking direction in the staked body 200, and the insulating layers SP1 are provided below such position in part of the columnar portion CLHR having the small diameter.

For the insulating layer SP1, an insulating material such as silicon oxide is used, for example.

A method of manufacturing a semiconductor storage device will be described in further detail below.

FIGS. 5 to 11 are cross-sectional view illustrating an example of a method of manufacturing the semiconductor storage device according to the first embodiment.

Figure 5:
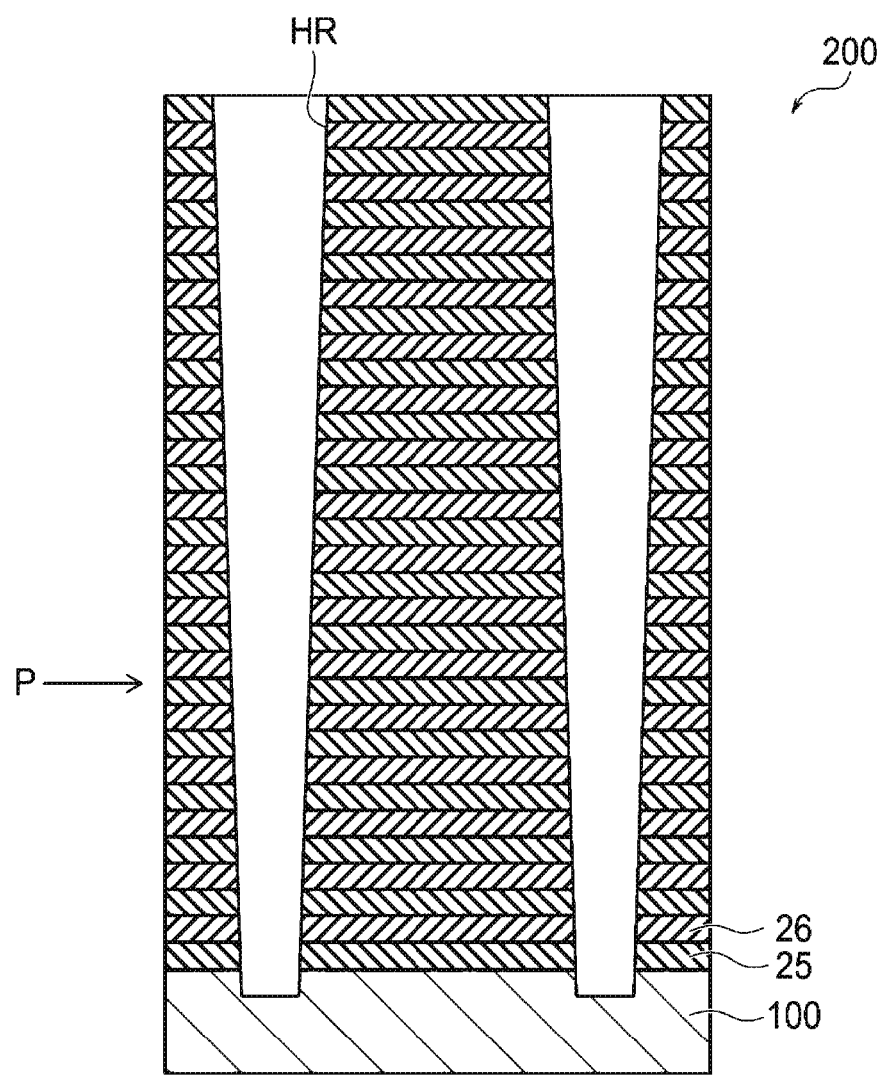
FIGS. 5-11 are cross-sectional views illustrating aspects of a method of manufacturing a semiconductor storage device according to a first embodiment.

First, as illustrated in FIG. 5, the plurality of holes HR are formed in the stacked body 200. The stacked body 200 includes the plurality of insulating layers 25 and a plurality of sacrificial layers 26 alternately stacked in the stacking direction, and the cell area AR1 and the lead area AR2 (FIG. 3) seen in the stacking direction are defined in the stacked body 200. The holes HR are formed in the lead area AR2, penetrating the stacked body 200 in the stacking direction. The holes HR are formed by, for example, the RIE method. The insulating layers 25 and the sacrificial layers 26 are exposed at the sidewalls of the holes HR. That is, ends of the insulating layers 25 and sacrificial layers 26 are on the side surfaces (or inner side surfaces) of the holes HR.

Figure 6:
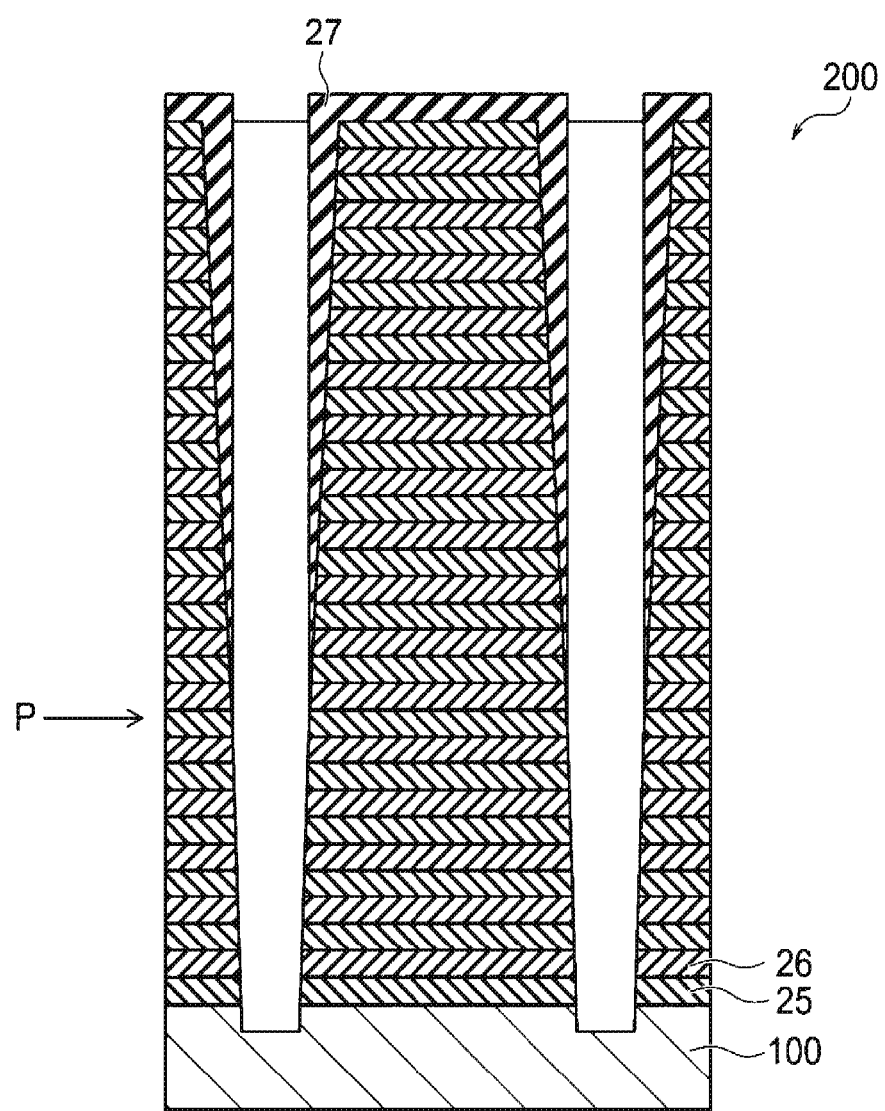

As illustrated in FIG. 6, a mask layer 27 is then formed on the side surface of each of the holes HR above the predetermined position P. The mask layer 27 is formed, for example, by an Atomic Layer Deposition (ALD) method. The present embodiment is not limited to the ALD method, and for example, the mask layer 27 may be formed on upper portions of the holes HR by adjusting conditions relating to embedding properties, such as deteriorating embedding properties, by other deposition methods. Silicon oxide is used, for example, for the mask layer 27.

Figure 7:
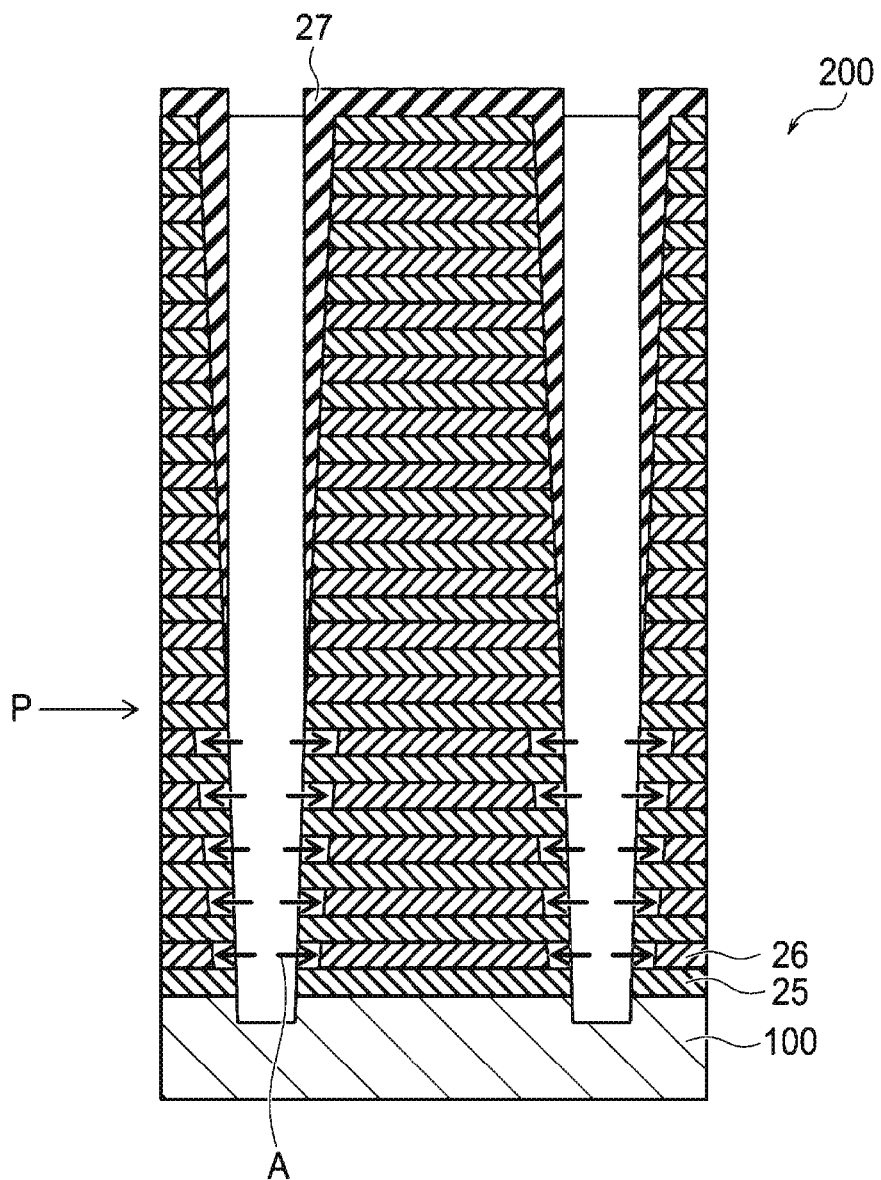

As illustrated in FIG. 7, by using the mask layer 27 as a mask, part of each of the sacrificial layers 26 is then removed. In the present embodiment, the sacrificial layers 26 located below the predetermined position P are partially removed by a predetermined distance in a diameter direction from the side surfaces of the holes HR. For example, in a case where the sacrificial layers 26 are silicon nitride films, the sacrificial layers 26 are selectively etched by using an etchant including phosphoric acid. The etching proceeds as presented with an arrow A. This makes the end surfaces or end portions of the sacrificial layers 26 retreated from the side surfaces of the holes HR in the diameter direction, that is the arrow A direction, thereby leaving the removed part or void regions in each of the sacrificial layers 26 located below the predetermined position P. The sacrificial layers 26 above the predetermined position P are covered with the mask layer 27 and thus are not removed by the etching.

Figure 8:
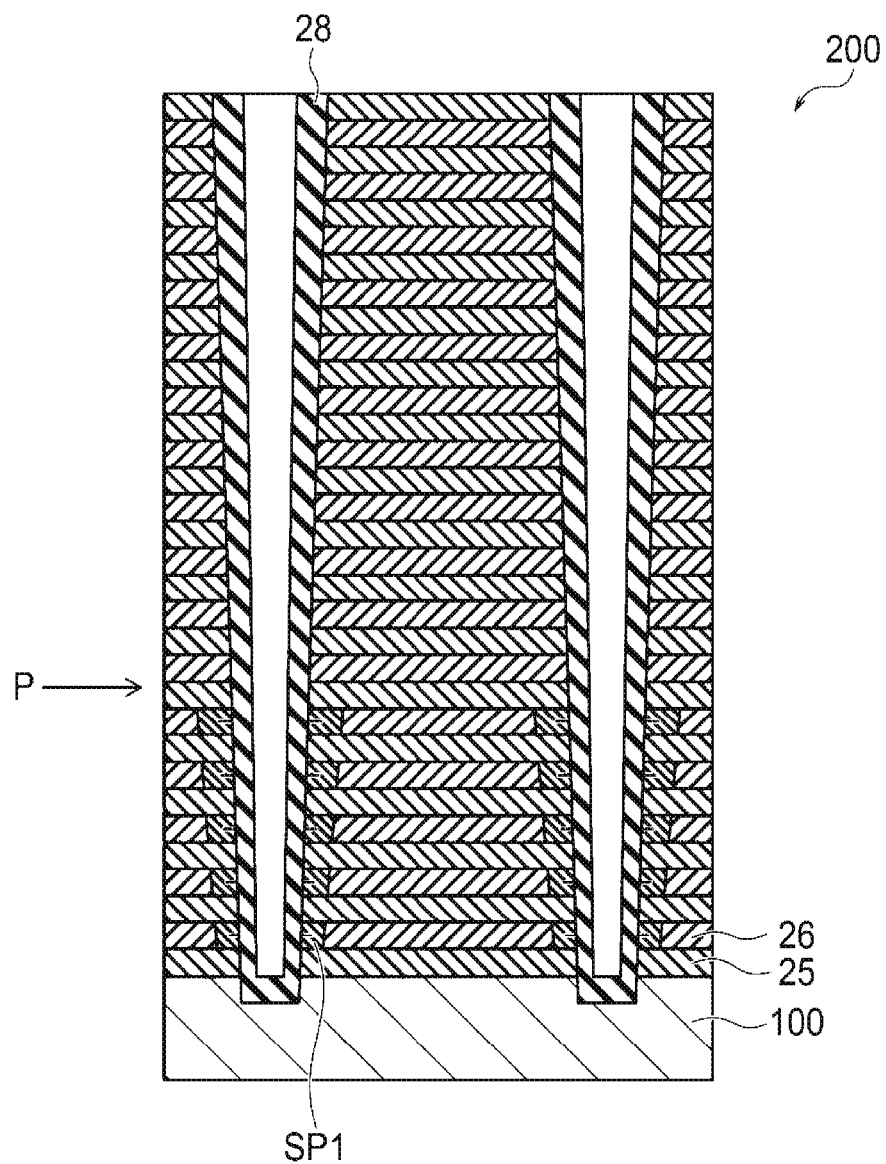

Subsequently, as illustrated in FIG. 8, the mask layer 27 is removed from the side surface of each of the holes HR and also from the upper portion of the stacked body 200, and insulating layers 28 are formed so as to fill the removed regions of the sacrificial layers 26. For example, the insulating layers 28 are formed by a chemical vapor deposition (CVD) method or the ALD method. This way, the insulating layers SP1 are formed in the regions or voids where the sacrificial layers 26 have been removed. In the example illustrated in FIG. 8, the insulating layers 28 are formed on the side surfaces and the bottom surfaces of the holes HR, and the holes HR are not completely buried. The height of each void formed by partially removing each of the sacrificial layers 26 is, for example, 30 nm, and the width of each of the holes HR is, for example, 150 nm. For the insulting layers 28, an insulating material such as silicon oxide is used, for example.

Figure 9:
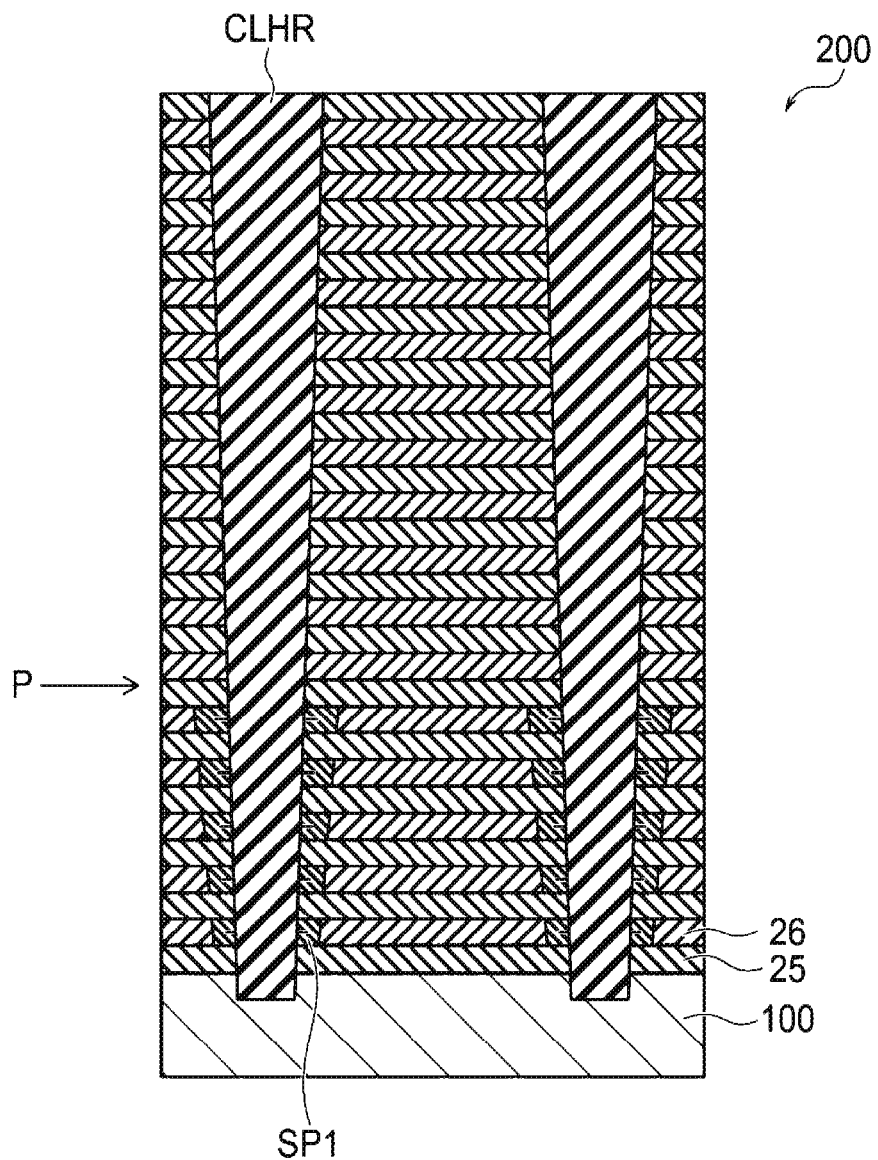

Then, as illustrated in FIG. 9, the columnar portions CLHR including the insulating layers (or third insulating layers) are formed in the respective holes HR. In the present embodiment, the materials to form the columnar portions CLHR are embedded in the holes HR. For example, an insulating material such as silicon oxide may be used. In a case where the same insulating material is used for both the insulating layers 28 during the previous step and the third insulating layers of the columnar portions CLHR in the present step, the insulating layers 28 may not be removed before the formation of the columnar portions CLHR in the holes HR.

Figure 10:
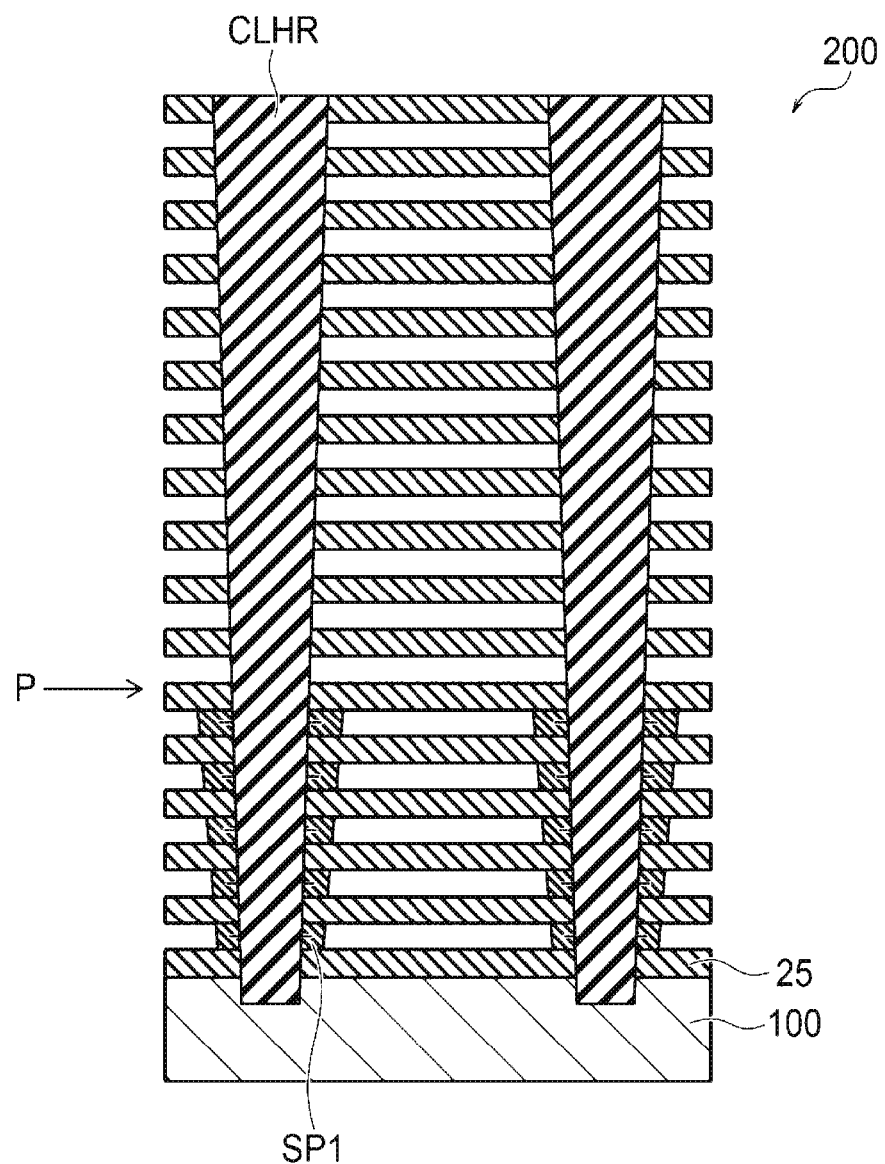

As illustrated in FIG. 10, all remaining sacrificial layers 26 are removed from the stacked body 200. For example, slits are formed in the stacking direction of the stacked body 200, and the sacrificial layers 26 between the insulating layers 25 are removed by a wet etching method via the slits. This leaves gaps between the insulating layers 25 are in the removed regions.

Figure 11:
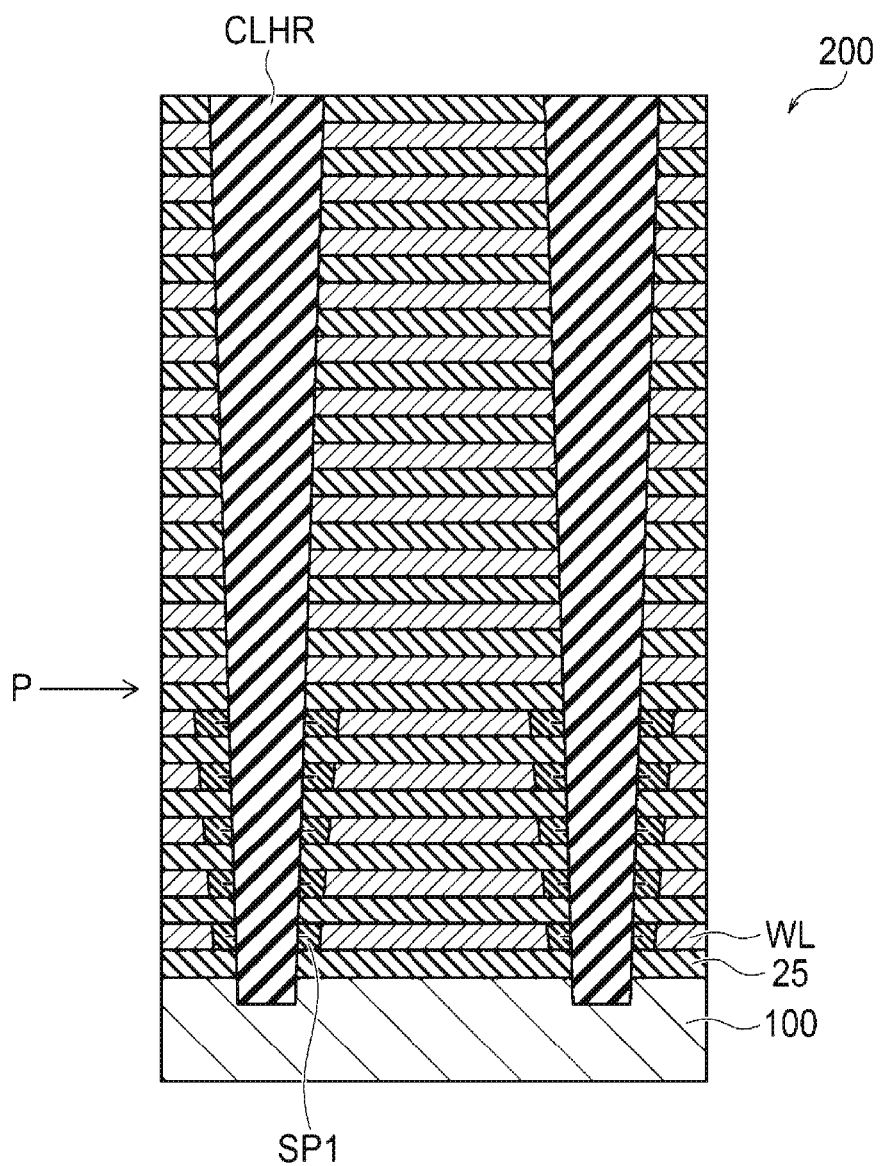

As illustrated in FIG. 11, the material of the conductive layers WL is then filled in the gaps between the insulating layers 25. In other words, the remaining sacrificial layers 26 are substituted or replaced with the conductive layers WL. In forming the conductive layers WL, a conductive material such as tungsten or doped silicon is used, for example. Accordingly, the stacked body 200 including the plurality of conductive layers WL and the plurality of insulating layers 25 stacked alternately is formed.

In addition, for example, after or at the same time the forming of the columnar portions CLHR, the contact plugs 40 may be formed (FIGS. 3 and 4). Lastly, wiring of the word lines and the like on the contact plugs 40 is formed. With this (or with any additional steps as appropriate), the semiconductor storage device according to the present embodiment is completed.

In some instance, it may not be necessary to remove the mask layer 27 before forming the insulating layer 28 (FIG. 8). In the completed semiconductor storage device, the silicon oxide of the mask layer 27 can be distinguished by the difference in film quality such as density from that of silicon oxide of the columnar portions CLHR. Further, silicon oxide of the insulating layers 25, the mask layer 27, the columnar portions CLHR, and the insulating layers SP1 can be distinguished from each other due to the difference in the manufacturing method.

In the present embodiments as described above, the columnar portions CLHR are provided in the lead area AR2, penetrating the stacked body 200, and include insulating layers (referred to as third insulating layers). The insulating layers SP1 are provided between the conductive layers WL and the third insulating layers of the columnar portions CLHR.

In order to improve the recording density, the stacked body 200 is stacked further densely by reducing the thickness of each of the conductive layers WL and the insulating layers 25. In such case, the thinned insulating layers 25 may be easily bent due to the gaps formed therebetween when the sacrificial layers 26 are substituted with the conductive layers WL. Furthermore, while bending of the insulating layers 25 in the cell area AR1 (first area) of the memory cell array MCA can be prevented by the memory holes MH provided at high density, the insulating layers 25 in the lead area (second are) AR2 of the memory cell array MCA may easily bend depending on the distance between the contact plugs 40 arranged apart from each other. Still furthermore, since the lead area AR2 exists in the outer region of the memory cell array MCA than the cell area AR1, the insulating layers 25 in the lead area AR2 may receive more external stress, which may cause deformation, than those in the lead area AR1.

In the present embodiment, to effectively prevent such deformation, including bending, of the insulating layers 25 in the lead area AR2 of the memory cell array MCA, the columnar portions CLHR penetrate the stacked body 200. The higher the density of the columnar portions CLHR is (that is, the more the columnar portions CLHR are provided in the lead area AR2), the more effectively deformation of the insulating layers 25 is prevented.

In a case where the columnar portions CLHR are provided in a higher-density arrangement, the columnar portions CLHR may interfere with the contact plugs 40. For example, the contact holes by the RIE method for providing the contact plugs 40 come into contact with the holes HR. When the etching rate of the film of the holes HR is high, the contact holes penetrate lower portions than the desired conductive layers WL due to over etching.

According to the present embodiments, without changing the arrangement of (or narrowing the distance between) the columnar portions CLHR, the insulating layers SP1 can protect the insulating layers 25 from deformation due to the gaps therebetween. Accordingly, possible deformation or collapse of the stacked structure 200 can be prevented, and the reliability of the semiconductor storage device can be improved. Furthermore, the pitch between the word lines (the conductive layers WL) can be narrowed, and the stacked body 200 can be stacked more densely. Still furthermore, the diameters of the contact plugs 40 can be increased by increasing the distance between the contact plugs 40 and the columnar portions CLHR, and thus the resistance can be reduced.

The insulating layers SP1 are provided below the predetermined position P in the present embodiment. When the holes HR are formed in the stacked body 200 by plasma etching, the upper portions of the holes HR may become wide while the lower portions thereof may become narrow. This may make the insulating layers 25 located at lower positions bend more easily. In the present embodiment, this can be effectively avoided by providing the insulating layers SP1 on the lower portion of the stacked body 200, that is below the predetermined position P. If the insulating layers SP1 are provided on the upper portion of the stacked body 200, when the columnar portions CLHR are provided near the contact plugs 40, the insulating layers SP1 may interfere with the contact plugs 40. In the present embodiment, such interference can be effectively avoided by not providing the insulating layers SP1 on the upper portion of the stacked body 200, that is above the predetermined position P. Accordingly, the insulating layers SP1 are provided according to the shapes of the columnar portions CLHR. The present embodiment is not limited to a case where the columnar portions CLHR are narrowed downward.

In some instance, the lead area AR2 may have a step structure. For example, the stacked body 200 may have a step structure with ends of each of the conductive layers WL being offset from each other to form a stair-stepped or terraced arrangement or the like in the lead area AR2 of the memory cell array MCA. In a stepped lead area AR2, a set of a conductive layer WL and an insulating layer 25 forms each step. In a terraced region at the ends of the conductive layers WL, the contact plugs 40 are connected to the conductive layers WL. Since the contact plugs 40 do not penetrate the stacked body 200, the insulating spacer 401 need not be provided. However, when the lead area AR2 have the stepped structure, in order to form the step structure, the number of steps increases in direct proportion to the number of stacks.

If the contact plugs 40 corresponding to the respective layers are formed, there is no need to process the stacked body 200 to a step-like structure. As a result, the number of photolithography steps (processes) can be reduced. The lead area AR2 can be reduced in size.

Second Embodiment

In a second embodiment, the insulating layers SP1 are provided above the predetermined position P.

Provision of the insulating layers SP1 above the predetermined position P prevents possible deformation of the stacked structure 200 above the predetermined position P. Furthermore, the diameter of each of the columnar portions CLHR can be increased overall. Still furthermore, the distance of each of the insulating layers SP1 below the predetermined position P extends in the diameter direction (of the columnar portion CLHR) is greater than the distance of each of the insulating layers SP1 above the predetermined position P extends in the diameter direction.

The rest of the configurations of the semiconductor storage device according to the second embodiment are substantially the same as the configurations of the semiconductor storage device according to the first embodiment, and thus details thereof are omitted.

Also, as for the method of manufacturing the semiconductor storage device of the second embodiment, the same steps as illustrated in FIGS. 5 to 11 can be utilized, except for an extra step between the step of FIG. 7 and the step of FIG. 8.

After the step of FIG. 7, the mask layer 27 is removed, and part of the sacrificial layers 26 above the predetermined position P are removed in the substantially same manner as that for the removal of part of sacrificial layers 26 below the predetermined position P. Because of this removal step, the sacrificial layers 26 below the predetermined position P are etched twice while the sacrificial layers 26 above the predetermined position P are etched only once. Accordingly, the sacrificial layers 26 below the predetermined position P are removed to a greater extent (a longer distance in the diameter direction of the holes HR) than the sacrificial layers 26 above the predetermined position P.

After the removal step, the subsequent steps illustrated in FIGS. 8 to 11 are utilized.

The semiconductor storage device according to the second embodiment can achieve substantially the same effects as those by the semiconductor storage device in the first embodiment, except for the additional effects achievable at least due to the insulating films SP1 above the predetermined position P.

Third Embodiment

Figure 12:
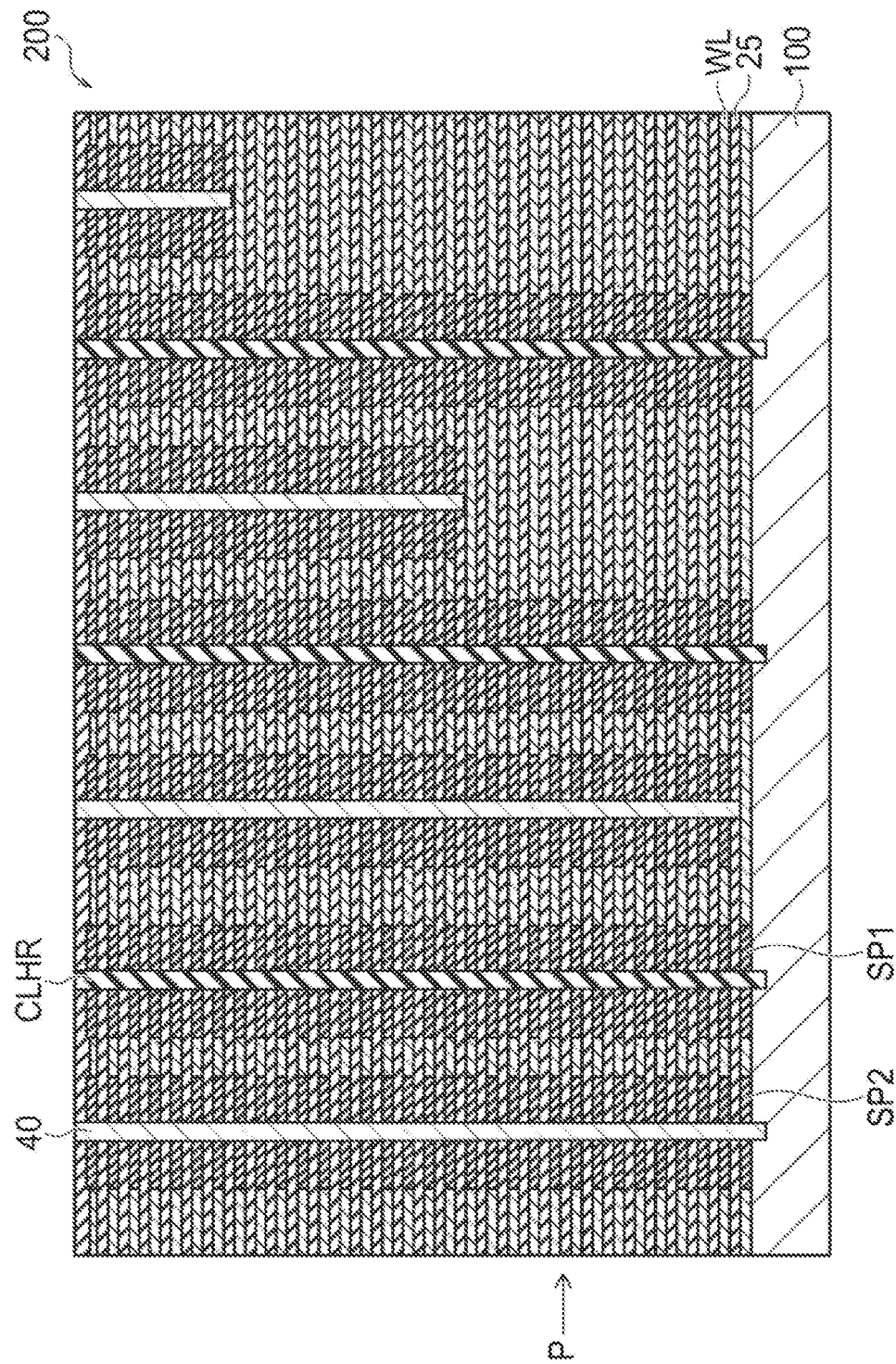
FIG. 12 is a cross-sectional view illustrating an example of a stacked body in a lead area of a memory cell array of a semiconductor storage device according to a third embodiment.

FIG. 12 is a cross-sectional view illustrating an example of the lead area AR2 according to a third embodiment. In the third embodiment, insulating layers SP2 (may also be referred to as "fourth insulating layers" herein) are provided in the stacked body 200 in the lead area AR2. The insulating layers SP1 are also provided above and below the predetermined position P in a similar manner to the second embodiment. In some examples, the insulating layers SP1 may only be provided below the predetermined position P in a similar manner to the first embodiment.

In the example of FIG. 12, the insulating layers SP2 are provided between the conductive layers WL and the contact plugs 40 (may also be referred to as "third columnar portions" in this context). More specifically, the insulating layers SP2 are provided on the outer periphery of each of the contact plugs 40 in the plane parallel to each of the conductive layers WL through which the contact plug 40 passes. Each insulating layer SP2 extends annularly from the outer periphery of each of the contact plugs 40.

The insulating layer SP2 contains, for example, an insulating material such as silicon oxide. The insulating material of the insulating layer SP2 may be the same as that of the insulating layer SP1. In the third embodiment, an insulating spacer such as the insulating spacer 401 shown in FIG. 4 according to the first embodiment may not be provided around the contact plugs 40. This is because in the third embodiment, the contact plugs 40 are electrically insulated from the conductive layers WL on the side surfaces by the insulating layers SP2.

The insulating layers SP2 may be provided either below or above of the predetermined position P.

Figure 13:
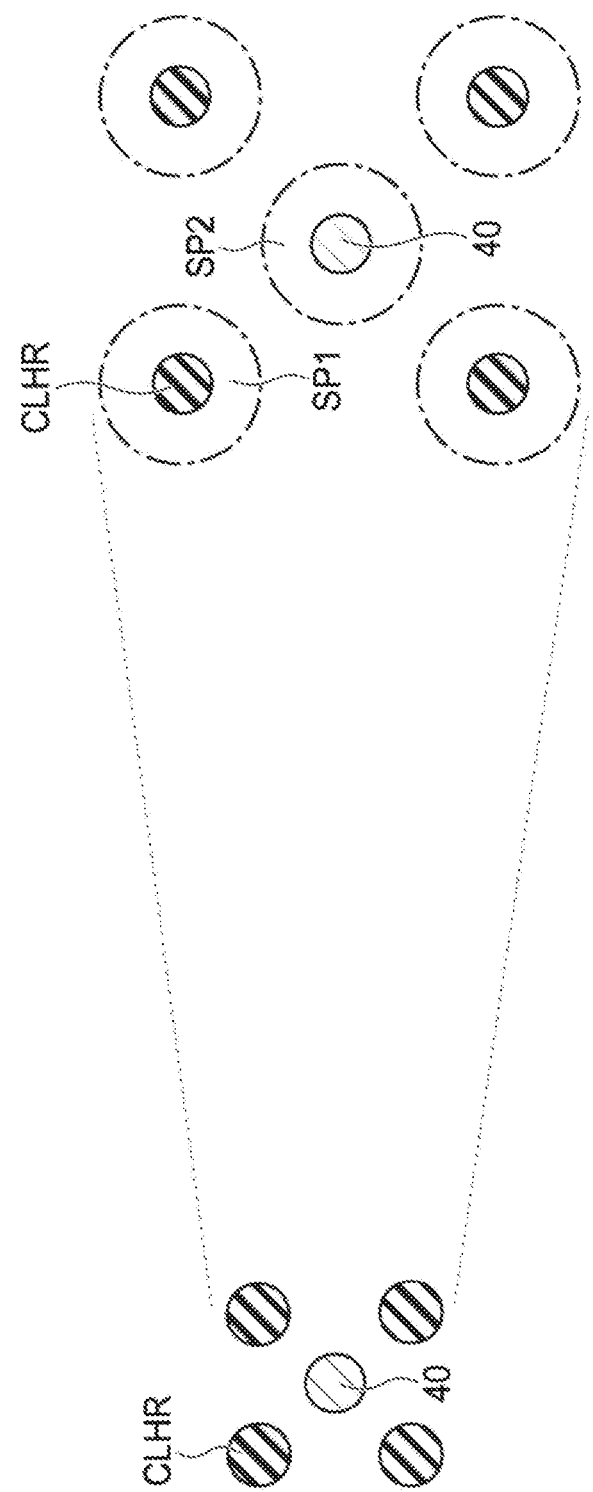
FIG. 13 is a schematic plan view illustrating an example of an arrangement of columnar portions and contact plugs in the stacked body according to a third embodiment.

FIG. 13 is a schematic plan view illustrating an example of the arrangement of the columnar portions CLHR and the contact plugs 40 according to the third embodiment. A plan view in the case where the insulating layers SP1 and SP2 are not provided is illustrated on the left side of FIG. 13, and a plan view in the case where the insulating layers SP1 and SP2 are provided is illustrated on the right side of FIG. 13. Regions where the insulating layers SP1 and SP2 are provided are presented with dashed lines.

The distance between the contact plug 40 and the surrounding columnar portions CLHR on the left side of FIG. 13 is substantially the same as the distance between the insulating layer SP2 and the surrounding insulating layers SP1 on the right side of FIG. 13. This arrangement can increase the distance between the contact plug 40 and the surrounding columnar portions CLHR while at the same time, supporting the stacked structure 200 to prevent its deformation. As a result, accuracy requirements of photolithography for forming the columnar portions CLHR and the contact plugs 40 can be relaxed. A desired alignment margin of the resist boundary can also be easily secured.

The rest of the configurations of the semiconductor storage device according to the third embodiment is substantially the same as the configurations of the semiconductor storage device according to the first embodiment, and thus details thereof are omitted.

The insulating layers SP2 are formed in the same manner as in the insulating layers SP1.

The semiconductor storage device according to the third embodiment can achieve substantially the same effects as those by the semiconductor storage device of the first embodiment. Also, the second embodiment may be combined with the semiconductor storage device according to the third embodiment.

Fourth Embodiment

Figure 14:
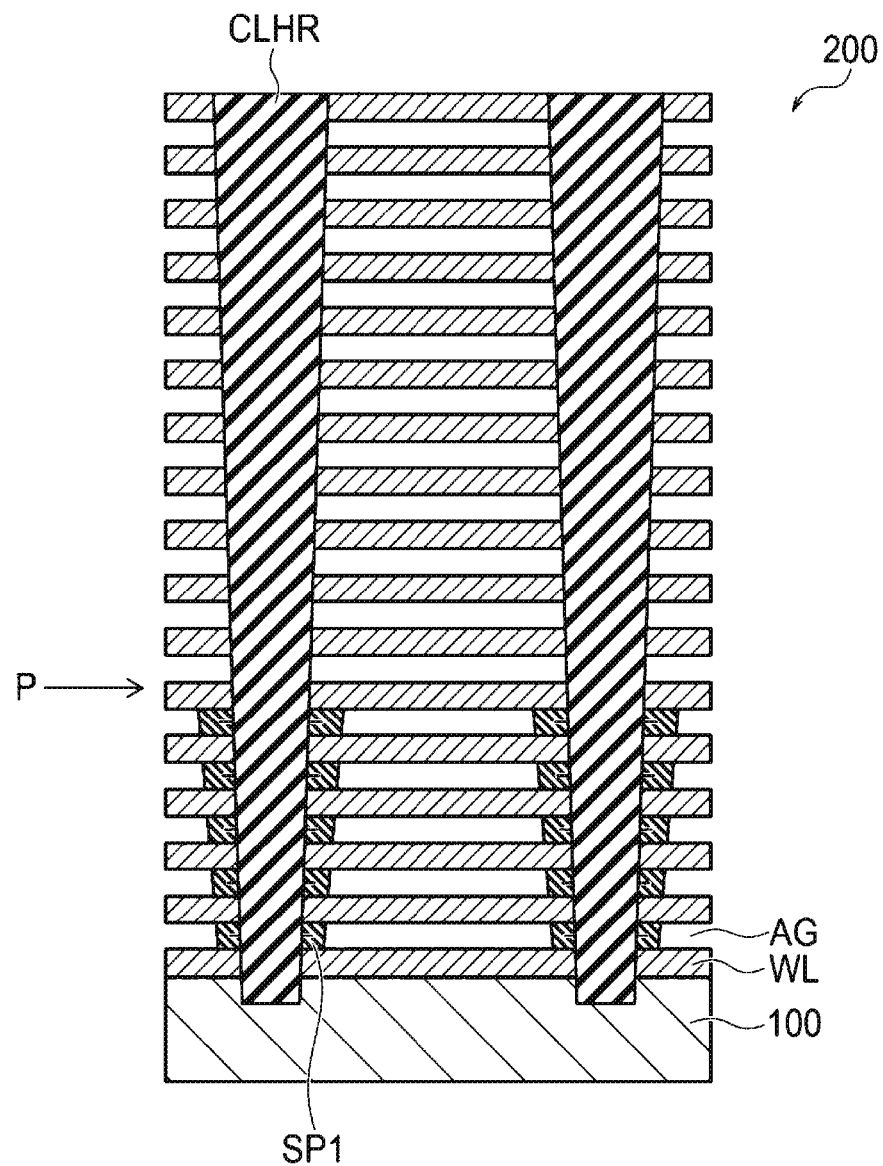
FIG. 14 is a cross-sectional view illustrating an example of a stacked body in a lead area of a memory cell array of a semiconductor storage device according to a fourth embodiment.

FIG. 14 is a cross-sectional view illustrating an example of the stacked body 200 in the lead area AR2 of the memory cell array MCA according to a fourth embodiment, and FIGS. 15 to 20 are cross-sectional views illustrating an example of the method of manufacturing the semiconductor storage device according to the fourth embodiment.

In the fourth embodiment, the insulating layers SP1 are provided in parallel to the levels of the insulating layers 25 (which are not separately depicted in FIGS. 14 to 20), not parallel to the levels of conductive layers WL as in the first embodiment (FIG. 11). Each of the insulating layers SP1 thus locates between the insulating layers 25 and the insulating layers (third insulating layers) of the columnar portions CLHR. Also, unlike the first embodiment where the sacrificial layers 26 are substituted with the conductive layers WL (FIGS. 9 to 11), the fourth embodiment does not require such substitution of sacrificial layers with the conductive layers WL.

Figure 19:
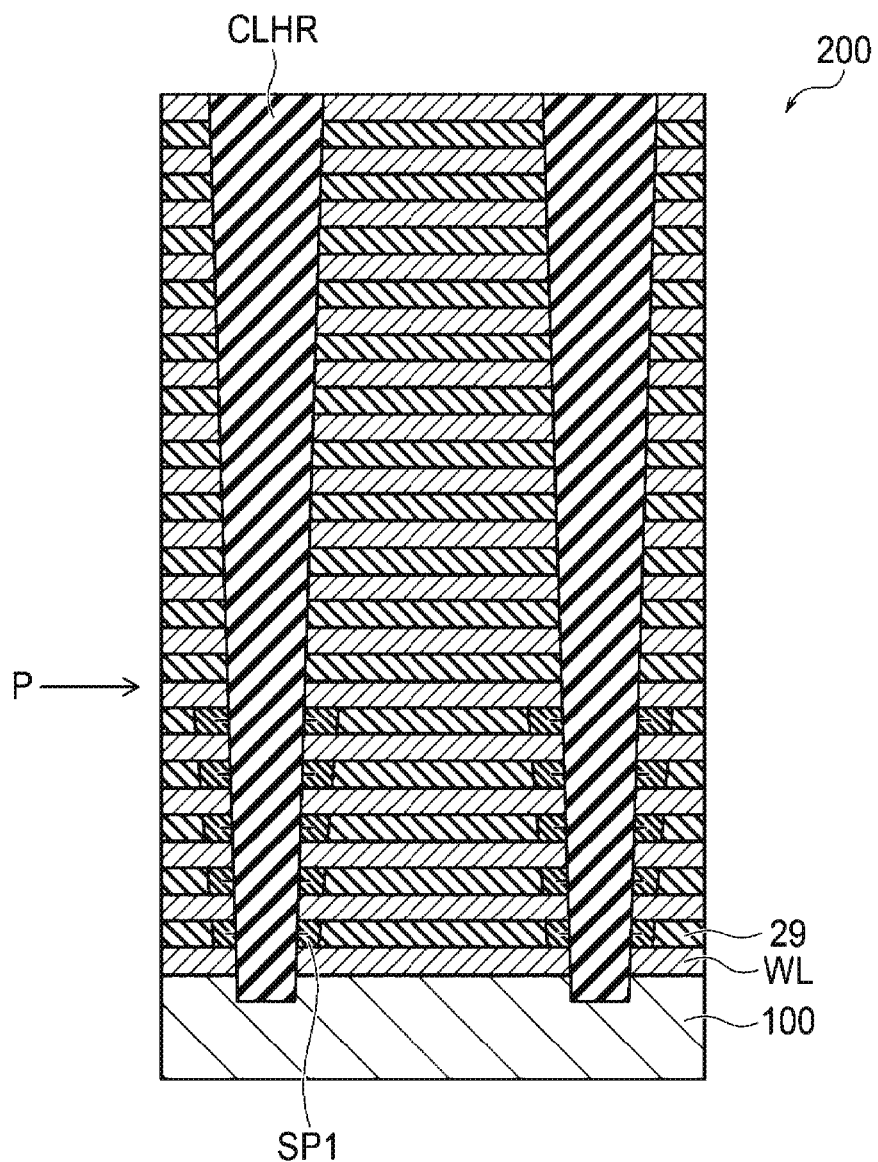
Figure 20:
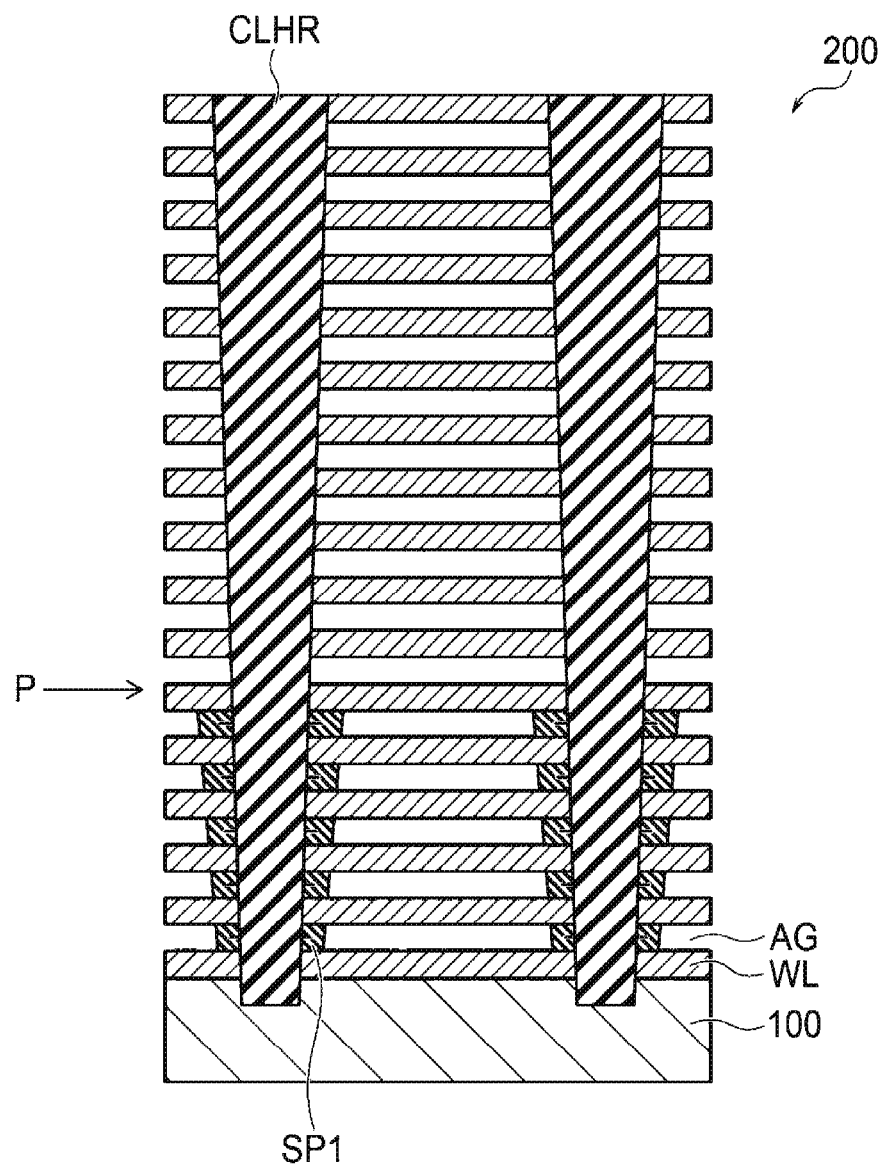

In at least part of the insulating layers 25 (or sacrificial layers 29 shown in FIGS. 15 to 19), air gaps AG are provided (FIG. 20). More specifically, at least a portion of each of the insulating layers 25 comprises the air gap AG sandwiched between the conductive layers WL. While not being separately depicted in FIG. 14, the insulating layers 25 are present in a region of the lead area AR2 not depicted here. Also, as will be further described later, the insulating layers 25 may be the sacrificial layers 29 in the fourth embodiment.

Further, by providing the air gaps AG between the conductive layers WL in the stacking direction or the thickness direction of the stacked body 200, parasitic capacitance between word lines (the conductive layers WL) can be reduced. As a result, any possible interference between adjacent memory cells can be reduced.

In some instance, air gaps AG may be provided in the cell area AR1 of the memory cell array MCA. However, since adjustment of regions where the air gaps AG are provided may not be easily performed, the air gaps AG may be provided in regions of the lead area AR2 near the cell area AR1. As described in the first embodiment, the stacked structure 200 may be more easily deformed in the lead area AR2 than in the cell area AR1. This may cause the conductive layers WL to easily bend, which may ultimately cause the stacked body 200 to deform, not only when the sacrificial layers 26 are substituted with the conductive layers WL (as in the first embodiment), but also when the air gaps AG are formed (as in the fourth embodiment). Since the air gaps AG are rarely present or does not substantially exist in the end portion of the lead area AR2 farthest from the cell area AR1, the insulating layers 25 are provided.

The insulating layers SP1 are provided between the insulating layers 25 and the insulating layers of the columnar portions CLHR. More specifically, the insulating layers SP1 are provided on the outer peripheries of the columnar portions CLHR in the planes parallel to the plurality of insulating layers 25, respectively. The insulating layers SP1 support the conductive layers WL to effectively prevent bending of the conductive layers WL during or after the formation of the air gaps AG, thereby ultimately preventing deformation or collapse of the stacked structure 200.

The rest of the configurations of the semiconductor storage device according to the fourth embodiment is substantially the same as the configurations of the semiconductor storage device according to the first embodiment, and thus details thereof are omitted.

Hereinafter, the method of manufacturing the semiconductor storage device according to the fourth embodiment is described in further details.

FIGS. 15 to 20 are cross-sectional views illustrating an example of the method of manufacturing the semiconductor storage device according to the fourth embodiment.

Figure 15:
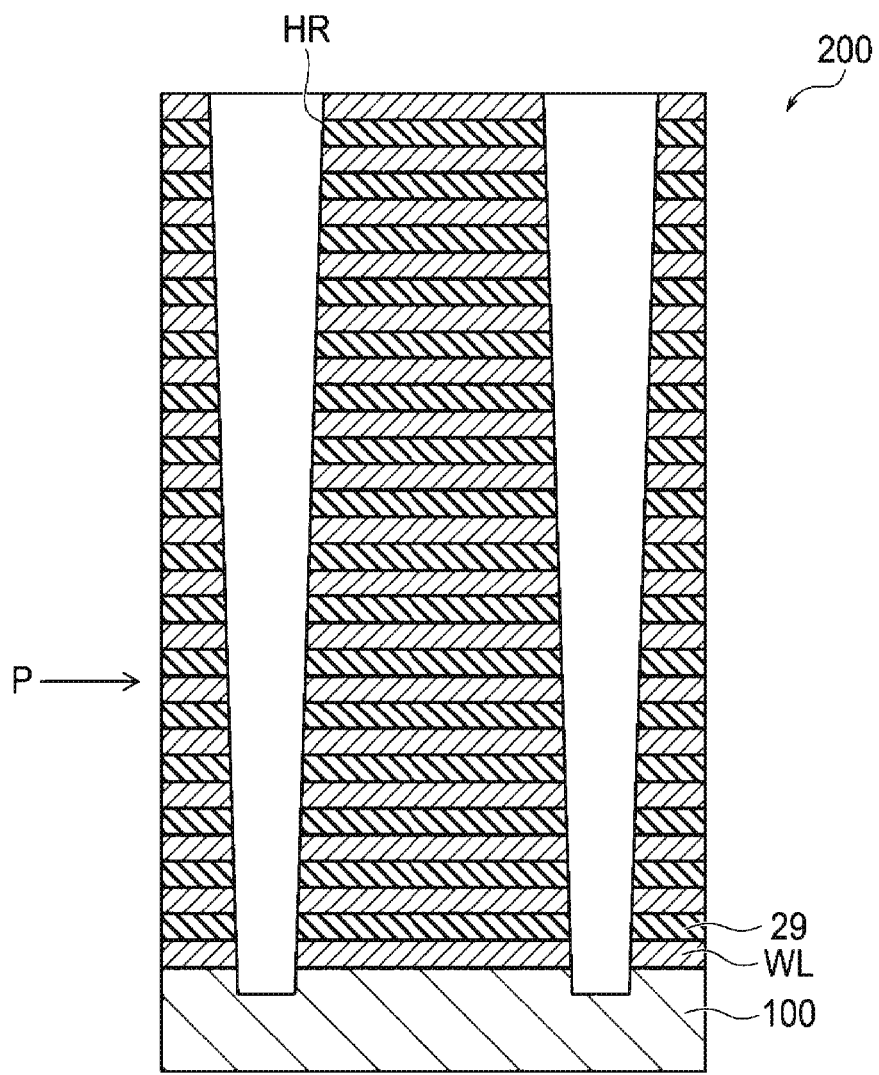
FIGS. 15-20 are cross-sectional views illustrating aspects of a method of manufacturing a semiconductor storage device according to a fourth embodiment.

First, as illustrated in FIG. 15, the holes HR are formed in the stacked body 200. The stacked body 200 includes the plurality of conductive layers WL and the plurality of sacrificial layers 29 alternately stacked in the stacking direction, and the cell area AR1 and the lead area AR2 seen in the stacking direction are defined in the stacked body 200. The holes HR are formed in the lead area AR2, penetrating the stacked body 200 in the stacking direction. In the present embodiment, for example, silicon oxide is used for the sacrificial layer 29, and the sacrificial layer 29 may also be the insulating layer 25. The present embodiment is not limited to this, and for example, silicon, metal, or silicon nitride may be used for the sacrificial layers 29.

Figure 16:
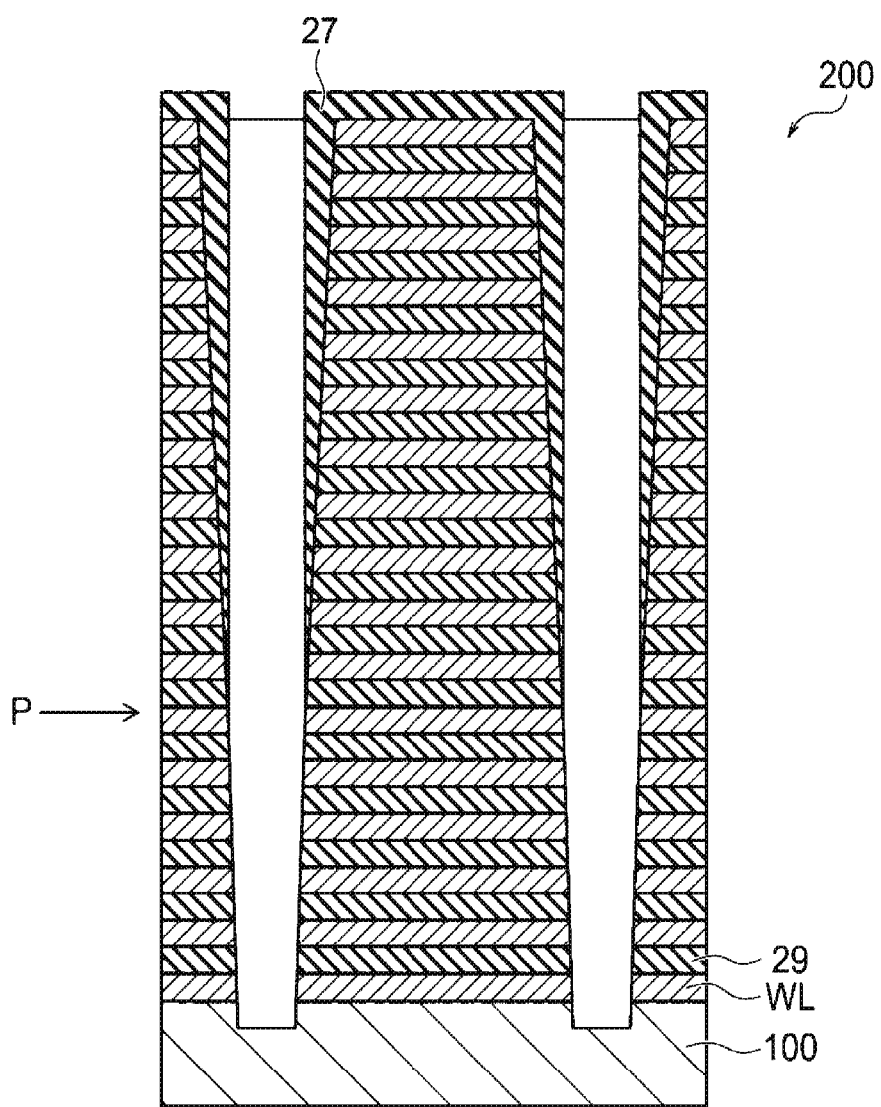

As illustrated in FIG. 16, the mask layer 27 is then formed on the inner side surface of each of the holes HR above the predetermined position P. For example, silicon nitride is used for the mask layer 27. In some instance, silicon oxide may be used for the mask layer 27. The mask layer 27 also extends to the upper surface of the stacked body 200.

Figure 17:
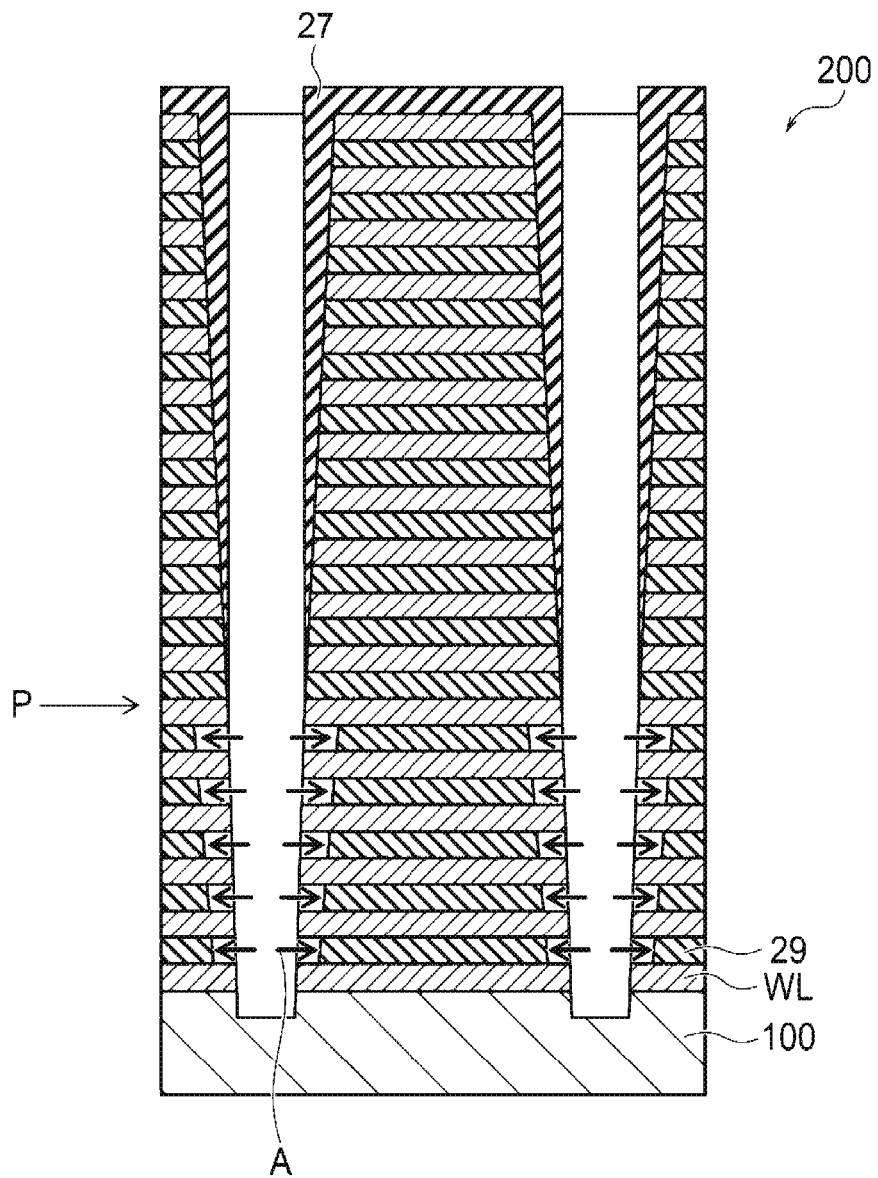

As illustrated in FIG. 17, part of each of the sacrificial layers 29 below the predetermined position P is removed by using the mask layer 27 as a mask. In the present embodiment, the sacrificial layers 29 below the predetermined position P are partially removed by a predetermined distance in the diameter direction from the inner side surfaces of the holes HR as shown with an arrow A, forming the removed part or void regions in the sacrificial layers 26. For the partial removal of the sacrificial layers 29, an etchant including fluorine may be used. If the sacrificial layers 29 are silicon, metal, or silicon nitride, for example, an alkaline aqueous solution, an aqueous solution including an oxidizing agent such as hydrogen peroxide or nitric acid, or hot phosphoric acid is used for removing the sacrificial layers 29. In consideration of chemical resistance to these chemicals, silicon nitride or silicon oxide may be used for the mask layer 27. The sacrificial layers 29 above the predetermined position P are covered with the mask layer 27 and thus are not removed by the etching.

Figure 18:
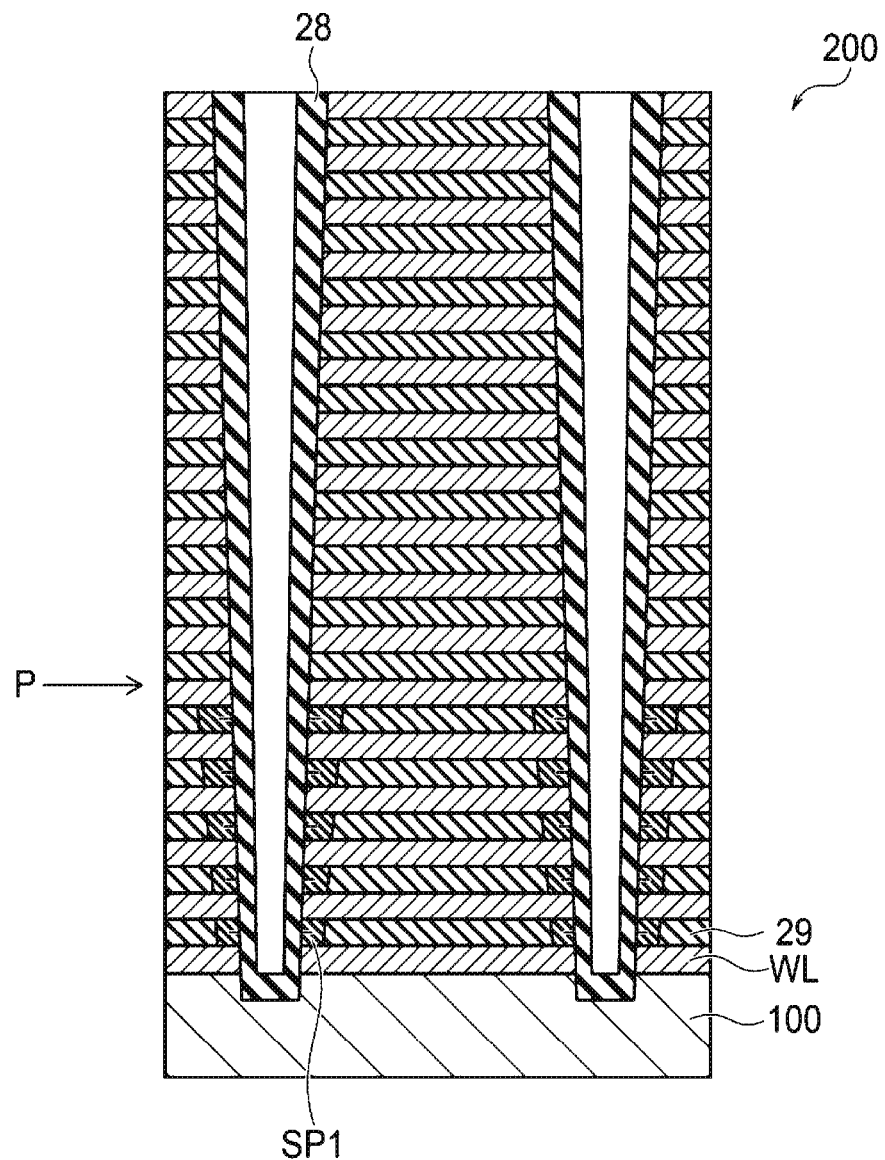

Subsequently, as illustrated in FIG. 18, the mask layer 27 is removed from the side surface of each of the holes HR and also from the upper surface of the stacked body 200, and the insulating layers 28 are formed so as to fill the removed regions of the sacrificial layers 29. For example, the insulating layers 28 are formed by a chemical vapor deposition (CVD) method or the ALD method. This way, the insulating layers SP1 are formed in regions where the sacrificial layers 29 have been removed.

Then, as illustrated in FIG. 19, the columnar portions CLHR including the insulating layers (third insulating layers) are formed in the respective holes HR. In the present embodiment, the materials to form the columnar portions CLHR are embedded in the holes HR. For example, an insulating material such as silicon oxide may be used.

Next, as illustrated in FIG. 20, at least part of the remaining sacrificial layers 29 is removed from the stacked body 200. This forms the air gaps AG in the removed part. For example, the sacrificial layers 29 are removed by using an etchant including fluorine.

The semiconductor storage device according to the fourth embodiment can achieve substantially the same effects as those of the semiconductor storage device in the first embodiment. Also, the second and third embodiments may be combined with the semiconductor storage device according to the fourth embodiment.

In FIG. 20, all of the remaining sacrificial layers 29 may be removed rather than just a portion or some of the sacrificial layers 29. In this case, as illustrated in FIG. 20, the stacked body 200 includes the plurality of conductive layers WL and gap layers (the air gaps AG) between the conductive layers WL and includes the cell area AR1 including memory cells and the lead area AR2 different from the cell area AR1 in the memory cell array MCA. The columnar portions CLHR are provided in the lead area AR2 to penetrate the stacked body 200 in the stacking direction and include the insulating layers. The insulating layers SP1 are between each of the gap layers and the insulating layers of the columnar portions CLHR.

Examples of Modified Embodiments

Figure 21:
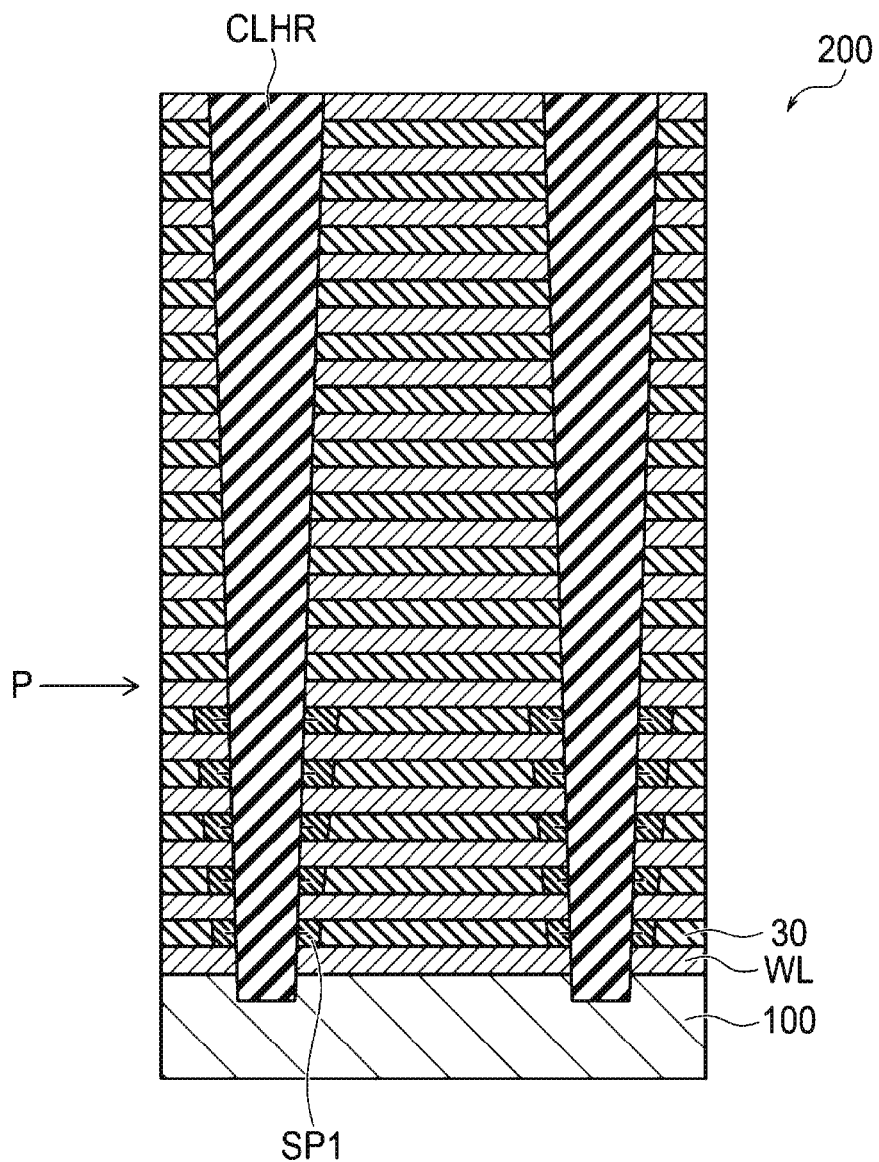
FIG. 21 is a cross-sectional view illustrating an example of a stacked body in a lead area of a memory cell array of a semiconductor storage device according to a modified embodiment.

FIG. 21 is a cross-sectional view illustrating an example of the stacked body 200 in the lead area AR2 of the memory cell array MCA according to a modified embodiment. In the modified embodiment, insulating layers 30 (may also be referred to as "fifth insulating layers" herein) are provided in the air gaps AG.

In some instances, the insulating layers 30 which are different types of material than the insulating layers 25, are provided. Specifically, the insulating layers 30 are provided in at least a portion of the insulating layers 25 between the plurality of conductive layers WL. The insulating layers 30 can fill the air gaps AG provided in the third embodiment. Each of the insulating layers 30 is, for example, a silicon oxide film. The insulating layers 25 and the insulating layers 30 may both be silicon oxide films, but in such a case, the insulating layers 25 and the insulating layers 30 may still be distinguished from each other based on a difference in film quality or other properties associated with deposition/formation parameters. In still some other instances, all of the insulating layers 25 may be substituted by the insulating layers 30.

The insulating layers SP1 are provided between the insulating layers 25 and the insulating layers of the columnar portions CLHR.

The rest of the configurations of the semiconductor storage device according to the modified embodiment is substantially the same as the configurations of the semiconductor storage device according to the fourth embodiment, and thus additional details thereof are omitted.

The semiconductor memory device according to the modified embodiment may be manufactured by utilizing the respective manufacturing steps in the fourth embodiment with an additional step specific to the insulating layers 30 in the modified embodiment.

For example, after the air gaps AG illustrated in FIG. 20 are formed, the air gaps AG are filled with an insulating material, such as silicon oxide, thereby forming the insulating layers 30 between the conductive layers WL as illustrated in FIG. 21. In other words, the insulating layers 30 are formed in the air gaps AG formed by removing part of the remaining sacrificial layers 29.

The semiconductor storage device according to the modified embodiment can achieve substantially the same effects as those by the semiconductor storage device in the fourth embodiment. Also, the second and third embodiments may be combined with the semiconductor storage device according to the modified embodiment.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a stacked body of a plurality of conductive layers and a plurality of first insulating layers alternately stacked in a first direction, the stacked body having a first area and a second area adjacent to each other as seen from the first direction;
a first columnar portion in the first area, the first columnar portion penetrating the stacked body in the first direction and being a memory pillar comprising a semiconductor layer;
a plurality of second columnar portions in the second area, each second columnar portion penetrating the stacked body in the first direction and spaced from each other in a second direction intersecting the first direction and comprising an insulating material and being structurally different from the first columnar portion; and
a plurality of second insulating layer portions, each second insulating layer portion extending in the second direction from an outer surface of one of the second columnar portions to an end of one of the conductive layers, each second insulating layer portion being between and contacting an adjacent pair of first insulating layers in the first direction, wherein
the plurality of second insulating layer portions extend for different distances in the second direction from the outer surface of the second columnar portions such that the distance in the second direction decreases with increasing distances from an upper end of the second columnar portions along the first direction.

2. The semiconductor storage device according to claim 1, wherein
a diameter of each of the second columnar portions decreases as the second columnar portion extends through the stacked body in the first direction, and
the second insulating layer portions are only present on the outer surface of the second columnar portions below an intermediate position along the first direction.

3. The semiconductor storage device according to claim 1, wherein
a diameter of each of the second columnar portions decreases as the second columnar portion extends through the stacked body in the first direction,
the second insulating layer portions are present on the outer surface of the second columnar portions along substantially the full length of the second columnar portions along the first direction.

4. The semiconductor storage device according to claim 1, further comprising:
a third columnar portion in the second area, the third columnar portion penetrating the stacked body in the first direction and being a contact plug comprising conductive material and structurally distinct from the second columnar portions, an end portion of the third columnar portion being electrically connected to at least one of the conductive layers; and
a fourth insulating layer between the third columnar portion and the conductive layers, wherein
the third columnar portion is offset from the second columnar portions in the second direction such that the third columnar portion does not overlap with any of the second columnar portions when viewed from the first direction.

5. The semiconductor storage device according to claim 1, wherein the first insulating layers comprise gaps.

6. The semiconductor storage device according to claim 1, further comprising:
a plurality of fifth insulating layers of a material different from that of the first insulating layers, the fifth insulating layers being adjacent to at least one of the plurality of first insulating layer, wherein
the second insulating layer portions are between the second columnar portions and the fifth insulating layers.

7. The semiconductor storage device according to claim 1, wherein the second insulating layer portions are between the second columnar portions and each one of the conductive layers in the stacked body.

8. The semiconductor storage device according to claim 1, wherein each of the second insulating layer portions extends radially from one of the second columnar portions and forms an annular shape.

9. The semiconductor storage device according to claim 1, wherein
the first area is memory cell region, and
the second area is a lead out region.

10. The semiconductor storage device according to claim 1, wherein the second columnar portions consist entirely of the insulating material.

11. The semiconductor storage device according to claim 10, further comprising:
a third columnar portion in the second area, the third columnar portion penetrating the stacked body in the first direction and consisting of a conductive material, an end portion of the third columnar portion being electrically connected to at least one of the conductive layers.

12. The semiconductor storage device according to claim 11, wherein the third columnar portion is a contact plug.

13. The semiconductor storage device according to claim 11, further comprising:
a third insulating layer on an outer periphery of the third columnar portion between the third columnar portion and the conductive layers.

14. The semiconductor storage device according to claim 11, further comprising:
a plurality of third insulating layers, each third insulating layer being between the third columnar portion and one of the conductive layers in the second direction and between first insulating layers in the first direction.

* * * * *